(12) United States Patent
Lee

(10) Patent No.: US 12,046,645 B2
(45) Date of Patent: Jul. 23, 2024

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/194,490

(22) Filed: Mar. 31, 2023

(65) Prior Publication Data

US 2023/0238437 A1 Jul. 27, 2023

Related U.S. Application Data

(63) Continuation of application No. 17/205,943, filed on Mar. 18, 2021, now Pat. No. 11,640,976.

(30) Foreign Application Priority Data

Sep. 22, 2020 (KR) ........................ 10-2020-0122210

(51) Int. Cl.
*H01L 29/417* (2006.01)
*H01L 29/10* (2006.01)

(52) U.S. Cl.
CPC .... *H01L 29/41741* (2013.01); *H01L 29/1037* (2013.01)

(58) Field of Classification Search
CPC ........... H01L 29/41741; H01L 29/1037; H01L 29/78642; H01L 27/11524; H01L 27/11556; H01L 21/76877; H01L 27/1157; H01L 27/11582; H01L 27/115–11597; G11C 16/00–349; H10B 43/00–50
See application file for complete search history.

(56) References Cited

U.S. PATENT DOCUMENTS

| | | | |
|---|---|---|---|
| 9,859,363 B2 | 1/2018 | Lu et al. | |
| 2019/0074291 A1 | 3/2019 | Lu et al. | |
| 2020/0020713 A1* | 1/2020 | Choi | H01L 23/53295 |
| 2020/0027896 A1* | 1/2020 | Eom | H10B 43/27 |
| 2020/0105784 A1* | 4/2020 | Jang | H10B 43/50 |
| 2020/0303284 A1* | 9/2020 | Yang | H01L 23/481 |
| 2021/0242236 A1* | 8/2021 | Shin | H10B 43/27 |

* cited by examiner

*Primary Examiner* — Shahed Ahmed
(74) *Attorney, Agent, or Firm* — WILLIAM PARK & ASSOCIATES LTD.

(57) ABSTRACT

A semiconductor device includes a stacked structure with first conductive layers and insulating layers that are stacked alternately with each other, second conductive layers located on the stacked structure, first openings passing through the second conductive layers and the stacked structure and having a first width, second conductive patterns formed in the first openings and located on the stacked structure to be electrically coupled to the second conductive layers, data storage patterns formed in the first openings and located under the second conductive patterns, and channel layers formed in the data storage patterns and the second conductive patterns.

18 Claims, 29 Drawing Sheets

B-B'

B-B'

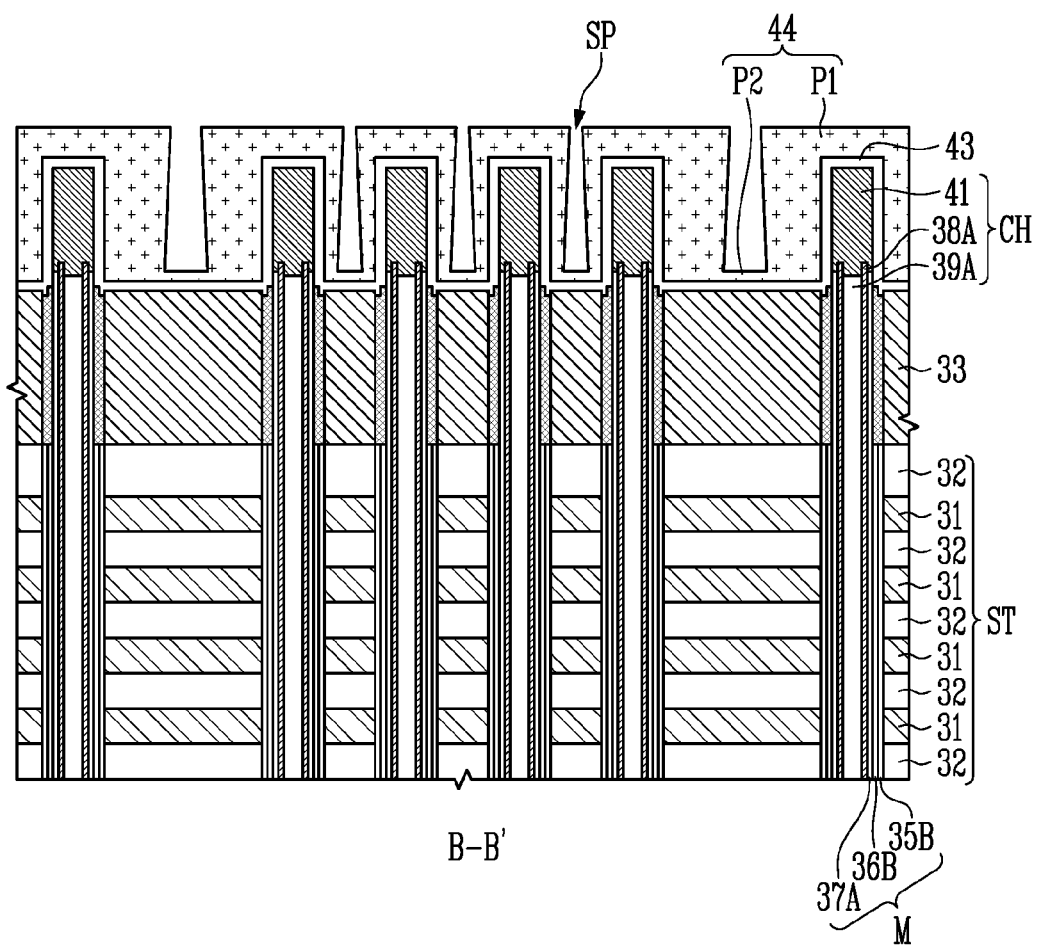

SEMICONDUCTOR DEVICE AND MANUFACTURING METHOD OF SEMICONDUCTOR DEVICE

CROSS-REFERENCE TO RELATED APPLICATIONS

The present application is a continuation application of U.S. patent application Ser. No. 17/205,943, filed on Mar. 18, 2021, and claims priority under 35 U.S.C. § 119(a) to Korean patent application number 10-2020-0122210 filed on Sep. 22, 2020, in the Korean Intellectual Property Office, the entire disclosure of which is incorporated by reference herein.

BACKGROUND

1. Technical Field

Various embodiments of the invention relate generally to an electronic device, and more particularly, to a semiconductor device and a method of manufacturing the semiconductor device.

2. Related Art

The increase in integration density of two-dimensional memory devices in which memory cells are formed in a single layer over a substrate has recently been limited. Thus, three-dimensional memory devices have been proposed in which memory cells are stacked in a vertical direction over a substrate. In addition, various structures and manufacturing methods have been developed to improve the operational reliability of three-dimensional memory devices.

SUMMARY

According to an embodiment, a semiconductor device may include a stacked structure with first conductive layers and insulating layers that are stacked alternately with each other, second conductive layers located on the stacked structure, first openings passing through the second conductive layers and the stacked structure and having a first width, second conductive patterns formed in the first openings and located on the stacked structure to be electrically coupled to the second conductive layers, data storage patterns formed in the first openings and located under the second conductive patterns, and channel layers formed in the data storage patterns and the second conductive patterns.

According to an embodiment, a semiconductor device may include a stacked structure including word lines and insulating layers stacked alternately with each other, wherein the word lines include first openings having a first width, select lines located on the stacked structure and including second openings having a second width less than the first width, an isolation insulating pattern located on the stacked structure and insulating the select lines from each other, data storage patterns formed in the first openings and located under the select lines, and channel layers formed in the data storage patterns and extending to the second openings.

According to an embodiment, a method of manufacturing a semiconductor device may include forming a stacked structure including first material layers and second material layers stacked alternately with each other, forming a conductive layer on the stacked structure, forming a sacrificial layer on the conductive layer, forming a first opening through the sacrificial layer, the conductive layer and the stacked structure, forming a data storage layer in the first opening, forming a channel structure in the data storage layer, removing the sacrificial layer so as to protrude the channel structure above the conductive layer, forming a second opening between the channel structure and the conductive layer by etching the data storage layer, forming a conductive pattern in the second opening, and forming an isolation insulating pattern through the conductive pattern.

BRIEF DESCRIPTION OF THE DRAWINGS

FIGS. 2A to 2F, FIGS. 3A to 3C, and FIGS. 4A to 4D, FIGS. 5A to 5C, FIGS. 6A to 6C, FIGS. 7A to 7D, and FIGS. 8A to 8D are diagrams illustrating a manufacturing method of a semiconductor device according to an embodiment of the present disclosure;

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various embodiments are directed to a semiconductor device having a stabilized structure and improved characteristics, and a method of manufacturing the semiconductor device.

Figure 1A:
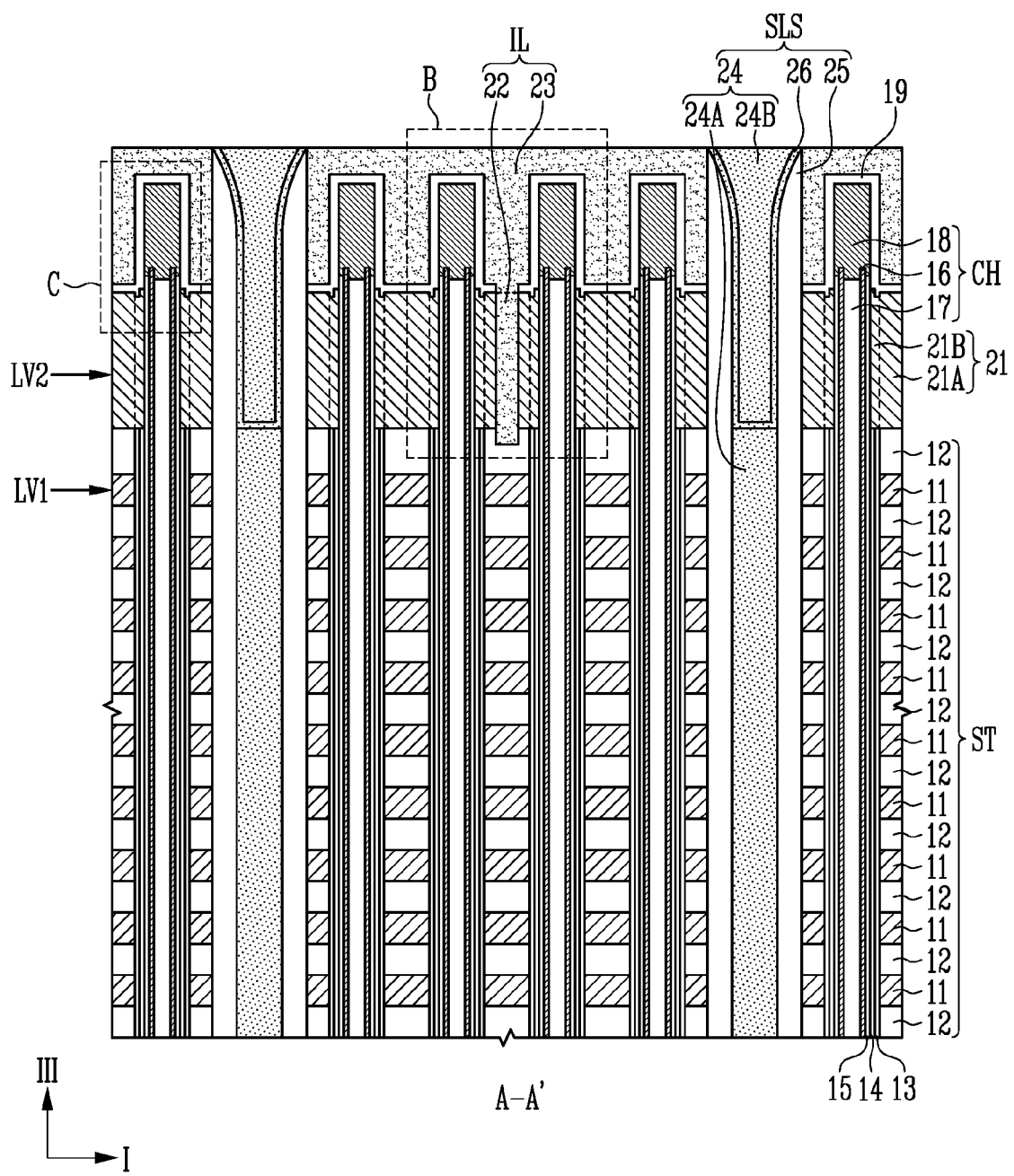
FIGS. 1A to 1E are diagrams illustrating the structure of a semiconductor device according to an embodiment of the present disclosure.
Figure 1B:
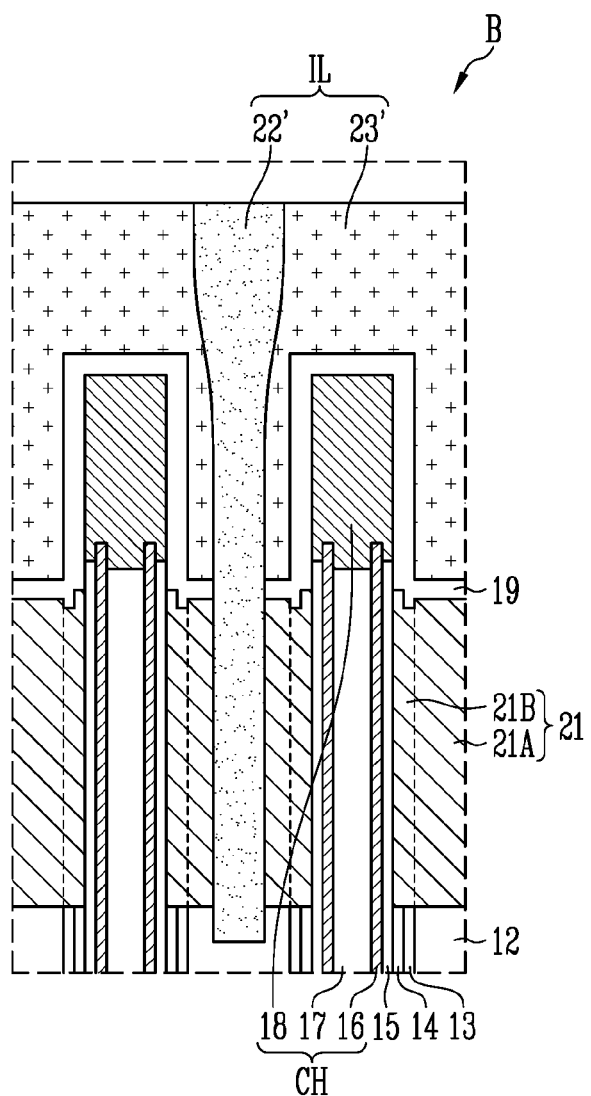
Figure 1C:
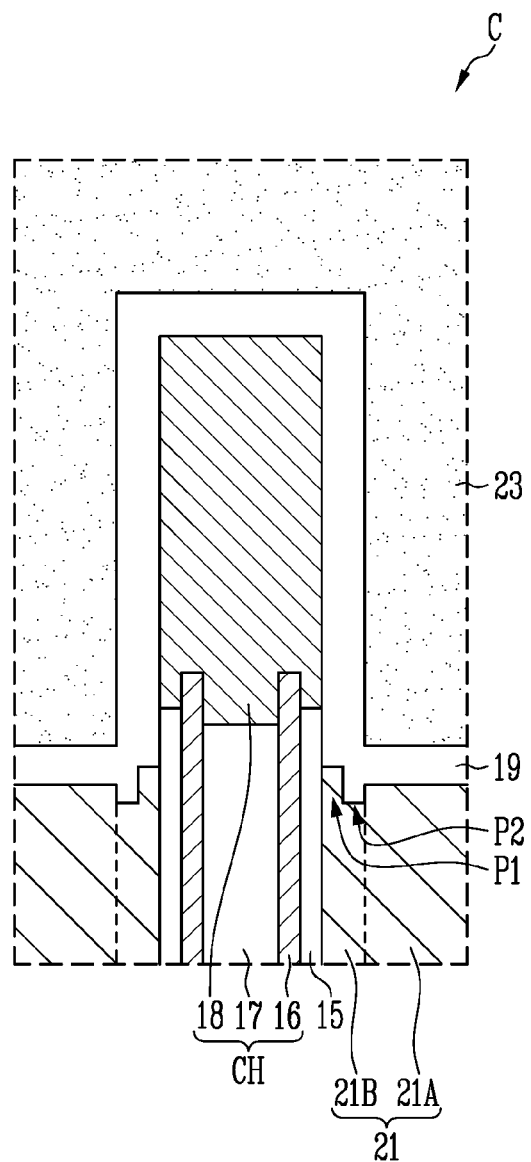
Figure 1D:
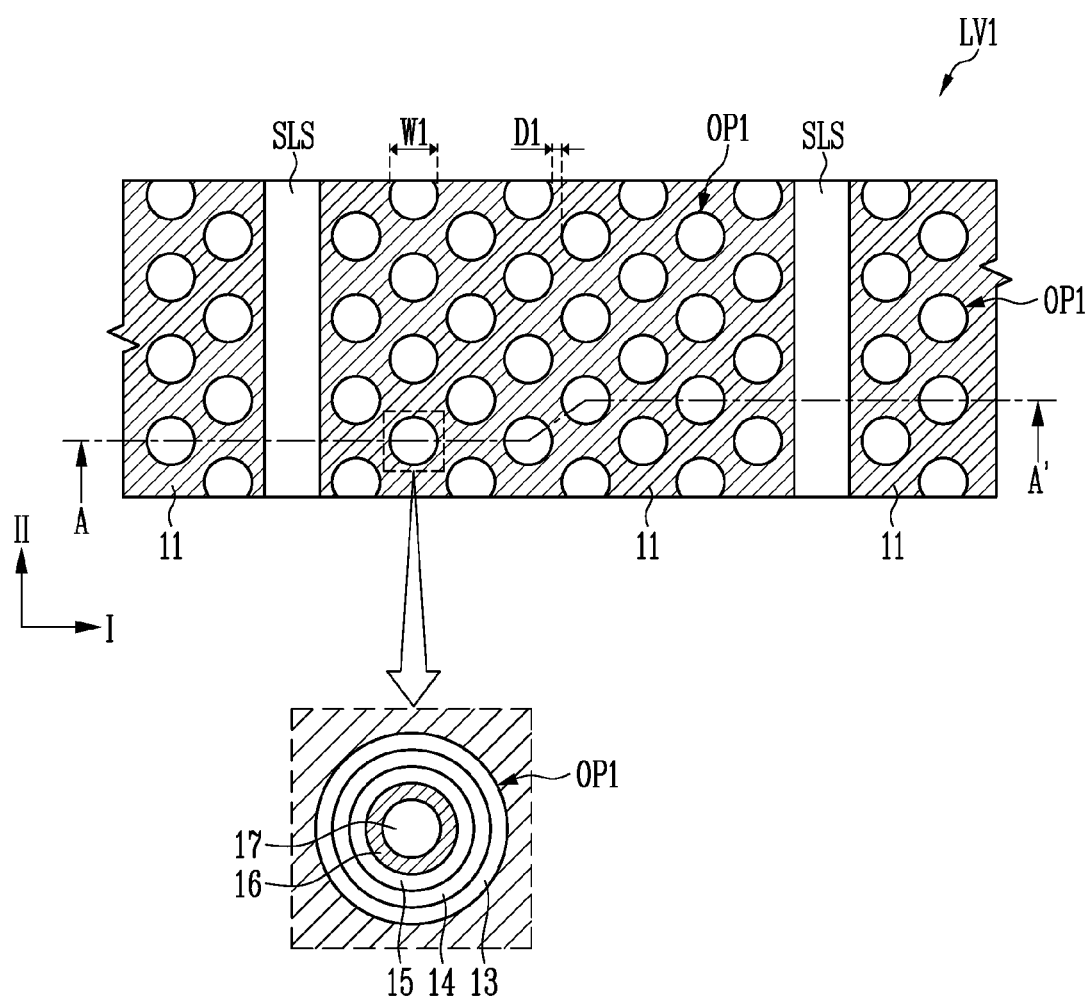
Figure 1E:
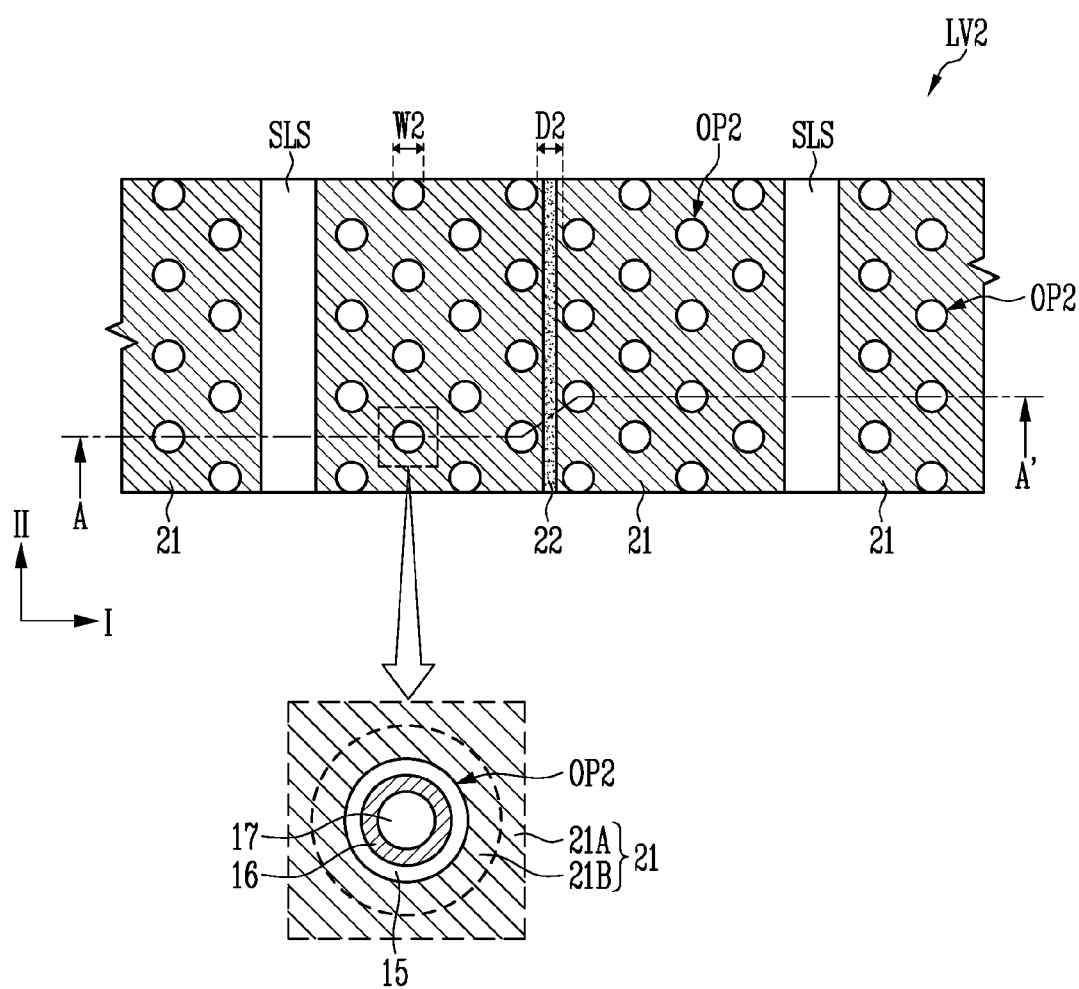

FIGS. 1A to 1E are diagrams illustrating the structure of a semiconductor device according to an embodiment of the present disclosure. FIG. 1A is an A-A' cross-sectional view of FIGS. 1D and 1E, FIG. 1D is a plan view of a first level LV1 of FIG. 1A, and FIG. 1E is a plan view of a second level LV2 of FIG. 1A. FIG. 1B is an enlarged view of a portion B of FIG. 1A and FIG. 1C is an enlarged view of a portion C of FIG. 1A.

Referring to FIGS. 1A to 1C, a semiconductor device may include a stacked structure ST, a conductive structure 21, data storage patterns 14 and channel layers 16. The semiconductor device may further include blocking patterns 13, tunnel insulating layers 15, insulating cores 17, channel pads 18, an insulating protective layer 19, an isolation insulating pattern 22, an interlayer insulating layer 23, a slit structure SLS, or a combination thereof.

The stacked structure ST may include first conductive layers 11 and insulating layers 12 that are stacked on each other. The first conductive layers 11 may be gate electrodes of memory cells, or word lines. The first conductive layers 11 may include a conductive material such as polysilicon, tungsten, molybdenum, or metal. The insulating layers 12 may insulate the stacked first conductive layers 11 from each other. The insulating layers 12 may include insulating materials such as oxides, nitrides, or air gaps.

The conductive structure 21 may be stacked on the stacked structure ST. The conductive structure 21 may be a gate electrode of a select transistor, or a select line. According to an embodiment, the conductive structure 21 may include a drain select line.

The conductive structure 21 may include second conductive layers 21A and second conductive patterns 21B. The second conductive layers 21A may be located over the stacked structure ST. Each of the second conductive layers 21A may commonly surround sidewalls of the plurality of channel layers 16. Each of the second conductive patterns 21B may surround the sidewall of each of the channel layers 16. The second conductive pattern 21B may be interposed between the channel layers 16 and the second conductive layers 21A. According to an embodiment, a plurality of second conductive patterns 21B may be electrically connected to one second conductive layer 21A. The second conductive layer 21A and the second conductive patterns 21B may be formed into a single layer. Alternatively, an interface may exist between the second conductive layer 21A and the second conductive patterns 21B.

The second conductive pattern 21B may have an uneven upper surface. Referring to FIG. 1C, the second conductive pattern 21B may include either or both of a protruding portion and a depressed portion. The upper surface of the second conductive pattern 21B may include a first portion P1 adjacent to the tunnel insulating layer 15 and a second portion P2 adjacent to the second conductive layer 21A. The second portion P2 may have a different level with respect to the first portion P1. According to an embodiment, the first portion P1 may have a higher level than the second portion P2. According to an embodiment, the first portion P1 may have a higher level than the upper surface of the second conductive layer 21A. The second portion P2 may have substantially the same level as the upper surface of the second conductive layer 21A, or may have a lower level than the upper surface of the second conductive layer 21A.

The second conductive layers 21A may include a conductive material such as polysilicon, tungsten, molybdenum, or metal. The second conductive patterns 21B may have materials that are the same or different from the second conductive layers 21A. The specific resistance of the second conductive patterns 21B may be equal to or less than that of the second conductive layers 21A. The second conductive patterns 21B may include polysilicon, metal, metal nitride, metal silicide, or the like. According to an embodiment, the second conductive patterns 21B may include tungsten, tungsten nitride, tungsten silicide, molybdenum, molybdenum nitride, molybdenum silicide, titanium, titanium nitride, titanium silicide, or a combination thereof.

The channel layers 16 may pass through the stacked structure ST and the conductive structure 21 in a third direction III. The third direction III may refer to a stacking direction of the first conductive layers 11 and the insulating layers 12. The channel layers 16 may protrude above the upper surface of the conductive structure 21. The channel pads 18 may be disposed over the conductive structure 21 and protrude above the upper surface of the conductive structure 21.

Each of the channel pads 18 may be coupled to each of the channel layers 16. Referring to FIG. 1C, the channel layer 16 may protrude into the channel pad 18. Since the channel pad 18 contacts the upper surface and the sidewall of the channel layer 16, a contact area may be increased. The channel pad 18 may be formed on the insulating core 17, the channel layer 16 and the tunnel insulating layer 15.

Each of the channel layers 16 may have a central region filled up, or an open central region. The open central region of each of the channel layers 16 may be filled with the insulating core 17. The insulating cores 17 may include an insulating material such as an oxide, a nitride, or air gaps. The channel layer 16, the insulating core 17 formed in the channel layer 16, and the channel pad 18 coupled to the channel layer 16 may form a single channel structure CH.

The tunnel insulating layers 15, the data storage patterns 14 and the blocking patterns 13 may be interposed between the channel layers 16 and the blocking patterns 13. The data storage patterns 14 may include a floating gate, a charge trapping material, polysilicon, a nitride, a variable resistance material, a phase change material, a nanostructure, or the like.

The tunnel insulating layers 15, the data storage patterns 14 and the blocking patterns 13 may surround the channel layers 16. The data storage patterns 14 and the blocking patterns 13 may be located under the conductive structure 21. According to an embodiment, the data storage patterns 14 and the blocking patterns 13 may be located under the second conductive patterns 21B. In a cross-sectional view, the thickness of each second conductive pattern 21B in a first direction I may be substantially the same as the sum of the thickness of the data storage pattern 14 in the first direction I and the thickness of the blocking pattern 13 in the first direction I. The first direction I may cross the third direction III.

Upper surfaces of the data storage patterns 14 and upper surfaces of the blocking patterns 13 may be located at substantially the same or different levels from each other. The upper surfaces of the data storage patterns 14 and the upper surfaces of the blocking patterns 13 may be located at a higher level than the upper surface of the uppermost first conductive layer 11. The upper surfaces of the data storage patterns 14 and the upper surfaces of the blocking patterns 13 may be located between the upper surface of the conductive structure 21 and the lower surface of the conductive structure 21, or between the lower surface of the conductive structure 21 and the upper surface of the uppermost first conductive layer 11. The distance between the second conductive patterns 21B and the uppermost first conductive layer 11 may be ensured by ensuring the distance between the upper surfaces of the data storage patterns 14 and the uppermost first conductive layer 11. Alternately, the distance between the second conductive patterns 21B and the uppermost first conductive layer 11 may be ensured by ensuring the distance between the upper surfaces of the blocking patterns 13 and the uppermost first conductive layer 11. Therefore, a breakdown voltage may be ensured.

The tunnel insulating layers 15 may extend between the channel layers 16 and the second conductive patterns 21B. According to an embodiment, each of the tunnel insulating layers 15 may be interposed between the channel layer 16 and the data storage pattern 14 and between the channel layer 16 and the second conductive pattern 21B. The tunnel insulating layers 15 may protrude above the upper surface of the conductive structure 21.

The insulating protective layer 19 may surround the channel pads 18. The insulating protective layer 19 may surround the channel pads 18 and the tunnel insulating layers 15 and may extend along the upper surface of the conductive structure 21. The insulating protective layer 19 may be interposed between the channel pads 18 and the interlayer insulating layer 23, between the tunnel insulating layers 15 and the interlayer insulating layer 23, and between the conductive structure 21 and the interlayer insulating layer 23. The insulating protective layer 19 may include an insulating material such as an oxide or a nitride.

An insulating layer IL may be located on the conductive structure 21. The insulating layer IL may include the isolation insulating pattern 22 and the interlayer insulating layer 23. The insulating layer IL may have a single-layer or multilayer structure.

The isolation insulating pattern 22 may be stacked on the stacked structure ST. The isolation insulating pattern 22 may pass through the conductive structure 21 in the third direction III and extend to the interlayer insulating layer 23. The isolation insulating pattern 22 may be interposed between the second conductive layers 21A and insulate the second conductive layers from each other. The isolation insulating pattern 22 may contact the second conductive layers 21A at both sides thereof. At least one of the second conductive patterns 21B may contact the isolation insulating pattern 22. The isolation insulating pattern 22 may include an insulating material such as an oxide, a nitride, or air gaps. The interlayer insulating layer 23 may be located on the conductive structure 21. The interlayer insulating layer 23 may include an insulating material such as oxide or nitride.

According to an embodiment, the interlayer insulating layer 23 and the isolation insulating pattern 22 may be coupled into a single layer. Referring to FIG. 1A, a portion of the insulating layer IL that passes through the conductive structure 21 may be the isolation insulating pattern 22, and a portion of the insulating layer IL that is formed above the conductive structure 21 may be the interlayer insulating layer 23.

According to an embodiment, the insulating layer IL may have a multilayer structure. Referring to FIG. 1B, the insulating layer IL may include an isolation insulating pattern 22' and an interlayer insulating layer 23'. An interface may be defined between the isolation insulating pattern 22' and the interlayer insulating layer 23'. The isolation insulating pattern 22' and the interlayer insulating layer 23' may include different materials. The isolation insulating pattern 22' may include an insulating material such as an oxide and a nitride. The interlayer insulating layer 23' may include an amorphous carbon layer. The isolation insulating pattern 22' may pass through the conductive structure 21 to extend between the channel pads 18. The isolation insulating pattern 22' may pass through the interlayer insulating layer 23'.

The slit structure SLS may pass through the interlayer insulating layer 23, the conductive structure 21 and the stacked structure ST. The slit structure SLS may be located between the channel layers 16 adjacent to each other in the first direction I. The slit structure SLS may extend between the second conductive layers 21A and between the channel pads 18. The slit structure SLS may pass through the interlayer insulating layer 23.

The slit structure SLS may include a source contact structure 24 and an insulating spacer 25 and may further include a barrier layer 26. The source contact structure 24 may include a conductive material such as polysilicon, tungsten, molybdenum, or a metal. The source contact structure 24 may have a single layer structure or a multilayer structure. According to an embodiment, the source contact structure 24 may include a polysilicon single layer. According to an embodiment, the source contact structure 24 may include a first contact structure 24A and a second contact structure 24B having a lower specific resistance than the first contact structure 24A. The first contact structure 24A may include polysilicon and the second contact structure 24B may include a metal. The second contact structure 24B may be separated from the uppermost first conductive layer 11 of the first conductive layers 11. The lower surface of the second contact structure 24B may be located in a higher level than the upper surface of the uppermost first conductive layer 11.

The barrier layer 26 may surround the source contact structure 24. The barrier layer 26 may be interposed between the source contact structure 24 and the insulating spacer 25. The barrier layer 26 may be interposed between the first contact structure 24A and the second contact structure 24B. The barrier layer 26 may include tungsten nitride, molybdenum nitride, tungsten nitride, tantalum nitride, or the like.

The insulating spacer 25 may be interposed between the source contact structure 24 and the first conductive layers 11 and between the source contact structure 24 and the conductive structure 21. The insulating spacer 25 may surround the sidewall of the source contact structure 24 and may include an insulating material such as an oxide, a nitride, or air gaps.

According to the above-described structure, memory cells may be located at intersections between the channel structure CH and the first conductive layers 11. Select transistors may be located at an intersection between the channel structure CH and the conductive structure 21. The memory cells may be located in the third direction III, and at least one select transistor may be stacked on the memory cells. The memory cells and at least one select transistor that are stacked on top of each other may share the channel layer 16 and the tunnel insulating layer 15. While a select transistor has a similar structure to a memory cell, the select transistor may include the second conductive pattern 21B instead of the data storage pattern 14 and the blocking pattern 13.

Referring to FIGS. 1A and 1D, each of the first conductive layers 11 may include first openings OP1. The first openings OP1 may be arranged in the first direction I and in a second direction II crossing the first direction I. Each of the first openings OP1 may have a circular cross-section, an elliptical cross-section, a polygonal cross-section, or the like. The channel layer 16, the tunnel insulating layer 15 and the data storage pattern 14 may be located in each of the first openings OP1. In addition, the blocking pattern 13 and the insulating core 17 may be located in each of the first openings OP1.

Referring to FIGS. 1A and 1E, the conductive structure 21 may include second openings OP2. The second openings OP2 may be arranged in the first direction I and the second direction II. The second openings OP2 may be located at positions corresponding to the first openings OP1. Each of the second openings OP2 may have a circular cross-section, an elliptical cross-section, a polygonal cross-section, or the like. The channel layer 16 and the tunnel insulating layer 15 may be located in each of the second openings OP2. In other words, the data storage pattern 14 and the blocking pattern 13 may not be located in the second openings OP2.

In a plan view, the second openings OP2 may have a smaller width than the first openings OP1. According to an embodiment, each of the first openings OP1 may have a first width W1 in the first direction I and each of the second openings OP2 may have a second width W2 in the first direction I. The second width W2 may be less than the first width W1.

In a plan view, the distance between the second openings OP2 may be greater than the distance between the first openings OP1. According to an embodiment, the first openings OP1 may be spaced apart from each other at a first distance D1 in the first direction I, and the second openings OP2 may be spaced apart from each other at a second distance D2 in the first direction I. The second distance D2 may be greater than the first distance D1.

The isolation insulating pattern 22 may pass through the conductive structure 21 between the second openings OP2. The second conductive layers 21A at both sides may be insulated from each other by the isolation insulating pattern 22. The isolation insulating pattern 22 may extend in the second direction II. The isolation insulating pattern 22 may contact the second conductive patterns 21B at both sides thereof. The tunnel insulating layers 15 and the second conductive patterns 21B may be interposed between the isolation insulating pattern 22 and the channel layers 16.

According to the above-described structure, since the second openings OP2 have a smaller width than the first openings OP1, the distance between the second openings OP2 may be selectively increased. In the first level LV1 where the isolation insulating pattern 22 is not formed, the first distance D1 may be maintained between the first openings OP1. In the second level LV2 where the isolation insulating pattern 22 is formed, the second distance D2 may be sufficiently maintained between the second openings OP2. Therefore, in the second level LV2, it may be possible to ensure a space where the isolation insulating pattern 22 is formed between the channel structures CH.

In addition, the sidewalls of the channel layers 16 located adjacent to the isolation insulating pattern 22 may be entirely surrounded by the second conductive patterns 21B. Therefore, the channel layers 16 located adjacent to the isolation insulating pattern 22 may serve as real channel layers, not dummy channel layers. In addition, since the select transistors have a gate all around (GAA) structure, they may have uniform characteristics.

FIGS. 2A to 2F, FIGS. 3A to 3C, and FIGS. 4A to 4D, FIGS. 5A to 5C, FIGS. 6A to 6C, FIGS. 7A to 7D, and FIGS. 8A to 8D are diagrams illustrating a manufacturing method of a semiconductor device according to an embodiment of the present disclosure. FIGS. 2A, 3A, 4A, 5A, 6A, 7A, and 8A and FIGS. 2B, 3B, 4B, 5B, 6B, 7B, and 8B are plan views, and FIGS. 2C, 3C, 4C, 5C, 6C, 7C, and 8C and FIGS. 2D, 4D, 7D, and 8D are cross-sectional views. Hereinafter, any repetitive detailed description of components having already been mentioned above will be omitted.

Referring to FIGS. 2A to 2F, the stacked structure ST, a conductive layer 33, a sacrificial layer 34, the first openings OP1, the channel structures CH and memory layers M may be formed. First, referring to FIGS. 2A to 2C, the stacked structure ST may be formed on a substrate (not shown) that includes a lower structure. The lower structure may include a peripheral circuit, an interconnection structure, a source structure or the like.

The stacked structure ST may include first material layers 31 and second material layers 32 that are stacked alternately with each other. The first material layers 31 may include a material having a high etch selectivity with respect to the second material layers 32. For example, the first material layers 31 may include a sacrificial material, such as nitride, and the second material layers 32 may include an insulating material, such as oxide. For example, the first material layers 31 may include a conductive material such as polysilicon, tungsten, or molybdenum, and the second material layers 32 may include an insulating material such as an oxide. The first material layers 31 may have the same or different thicknesses from each other. According to an embodiment, at least one lowermost first material layer 31 may have a greater thickness than the other first material layers 31. Each of the second material layers 32 may have the same or different thicknesses in comparison with each other. According to an embodiment, at least one uppermost second material layer 32 may have a greater thickness than the other second material layers 32.

The conductive layer 33 may be formed on the stacked structure ST. The conductive layer 33 may be a gate electrode of a select transistor, or a select line. The conductive layer 33 may include a conductive material such as polysilicon, tungsten, or molybdenum. The sacrificial layer 34 may be formed on the conductive layer 33. The sacrificial layer 34 may include a nitride layer, a carbon layer, an amorphous carbon layer, or the like. The sacrificial layer 34 may serve as a hard mask during subsequent processes.

The first openings OP1 may be formed through the sacrificial layer 34, the conductive layer 33 and the stacked structure ST. The first openings OP1 may be arranged in the first direction I and in the second direction II crossing the first direction I.

Figure 2A:
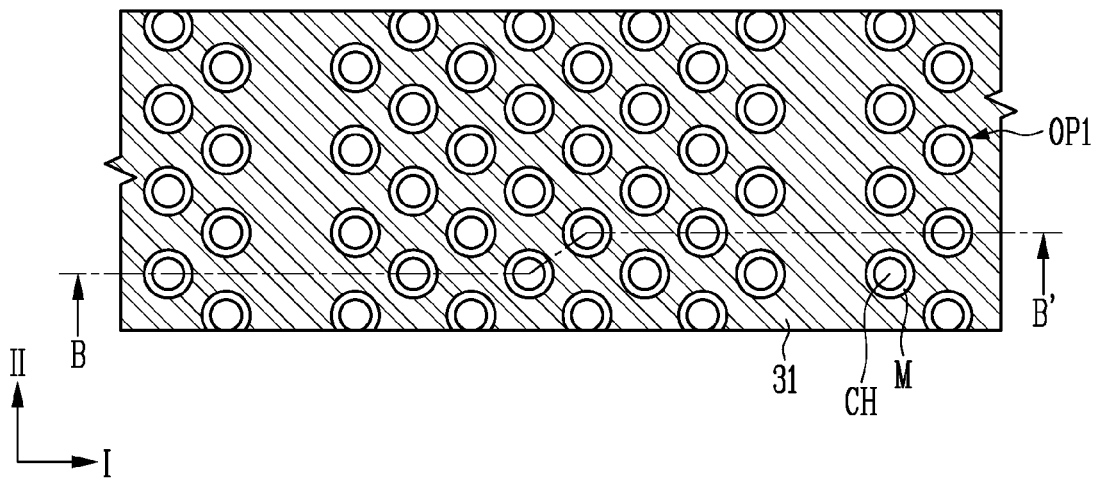
Figure 2B:
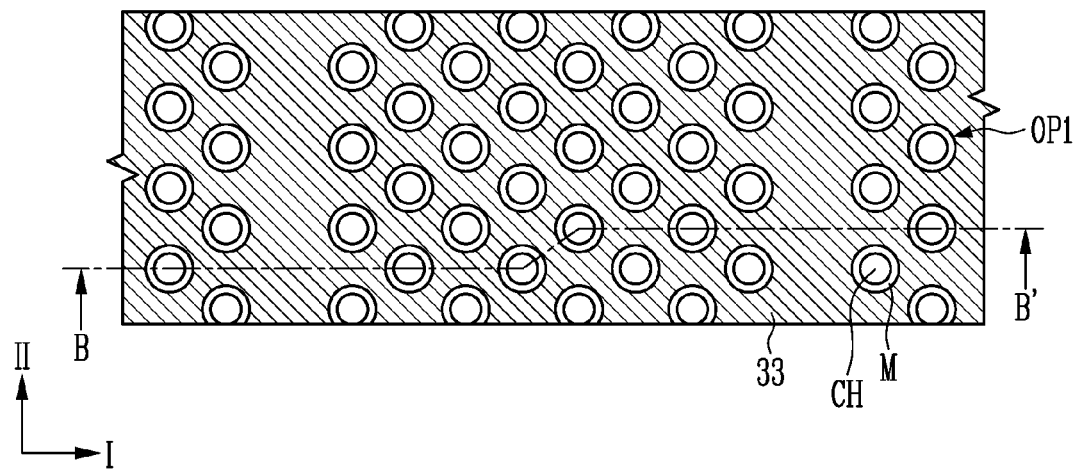
Figure 2C:
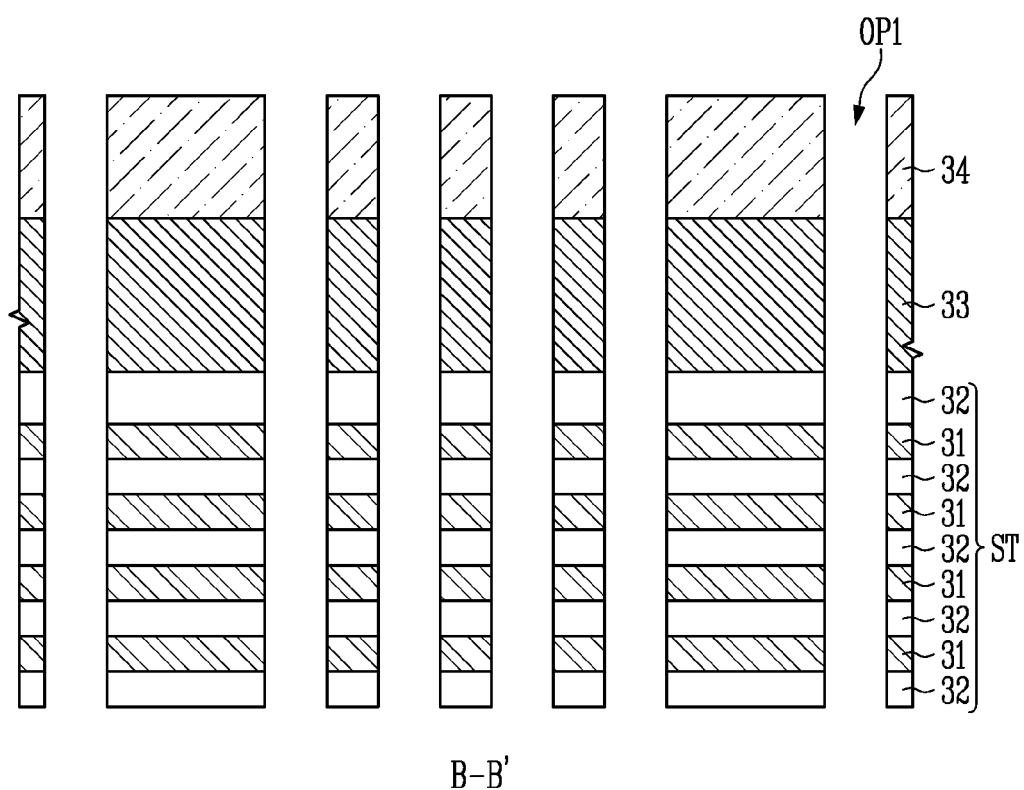
Figure 2D:
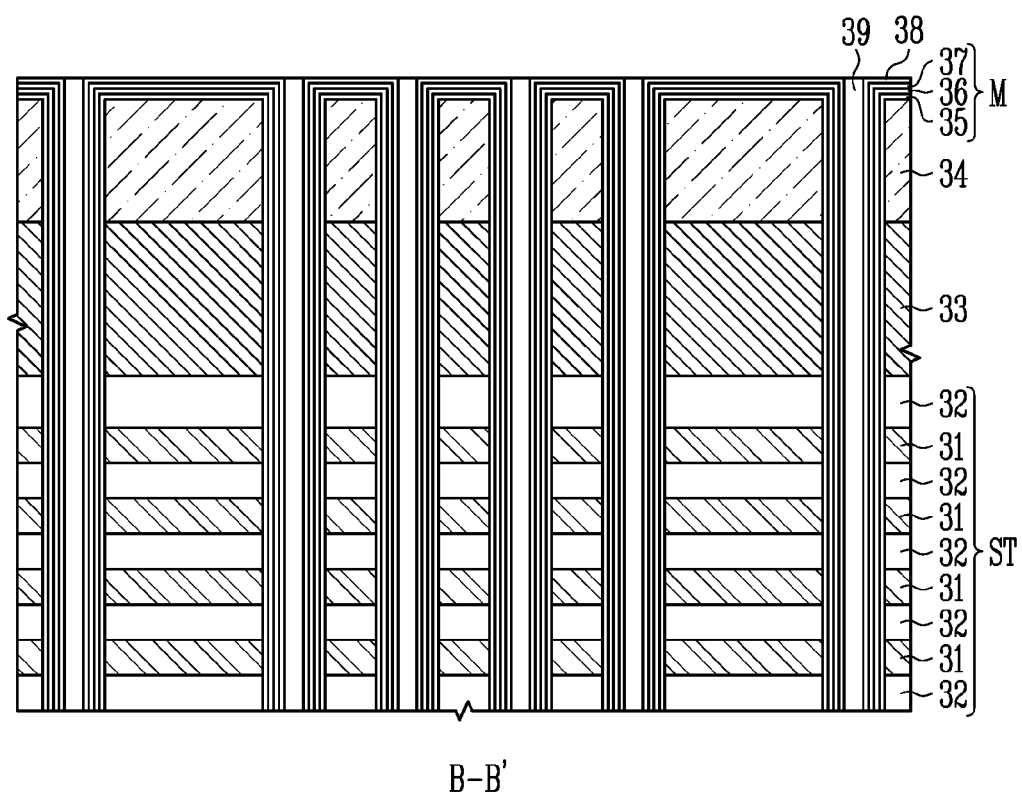

Referring to FIGS. 2A, 2B and 2D, a memory layer M may be formed in the first openings OP1. The memory layer M may include at least one of a blocking layer 35, a data storage layer 36 and a tunnel insulating layer 37. The memory layer M may be formed along inner surfaces of the first openings OP1 and may be formed on the upper surface of the stacked structure ST. According to an embodiment, the blocking layer 35, the data storage layer 36 and the tunnel insulating layer 37 may be formed in a sequential manner. A buffer layer (not shown) may be formed before the memory layer M is formed. The buffer layer may serve to protect the memory layer M when removing the first material layers 31 during subsequent processes. The buffer layer may include nitride.

Subsequently, a channel layer 38 may be formed in the first openings OP1. The channel layer 38 may include a semiconductor material such as silicon or germanium, or may include a nanostructure. The channel layer 38 may be formed along the surface of the memory layer M. Subsequently, an insulating core 39 may be formed in the first openings OP1. The insulating core 39 may include an insulating material such as an oxide, a nitride, or air gaps.

Figure 2E:
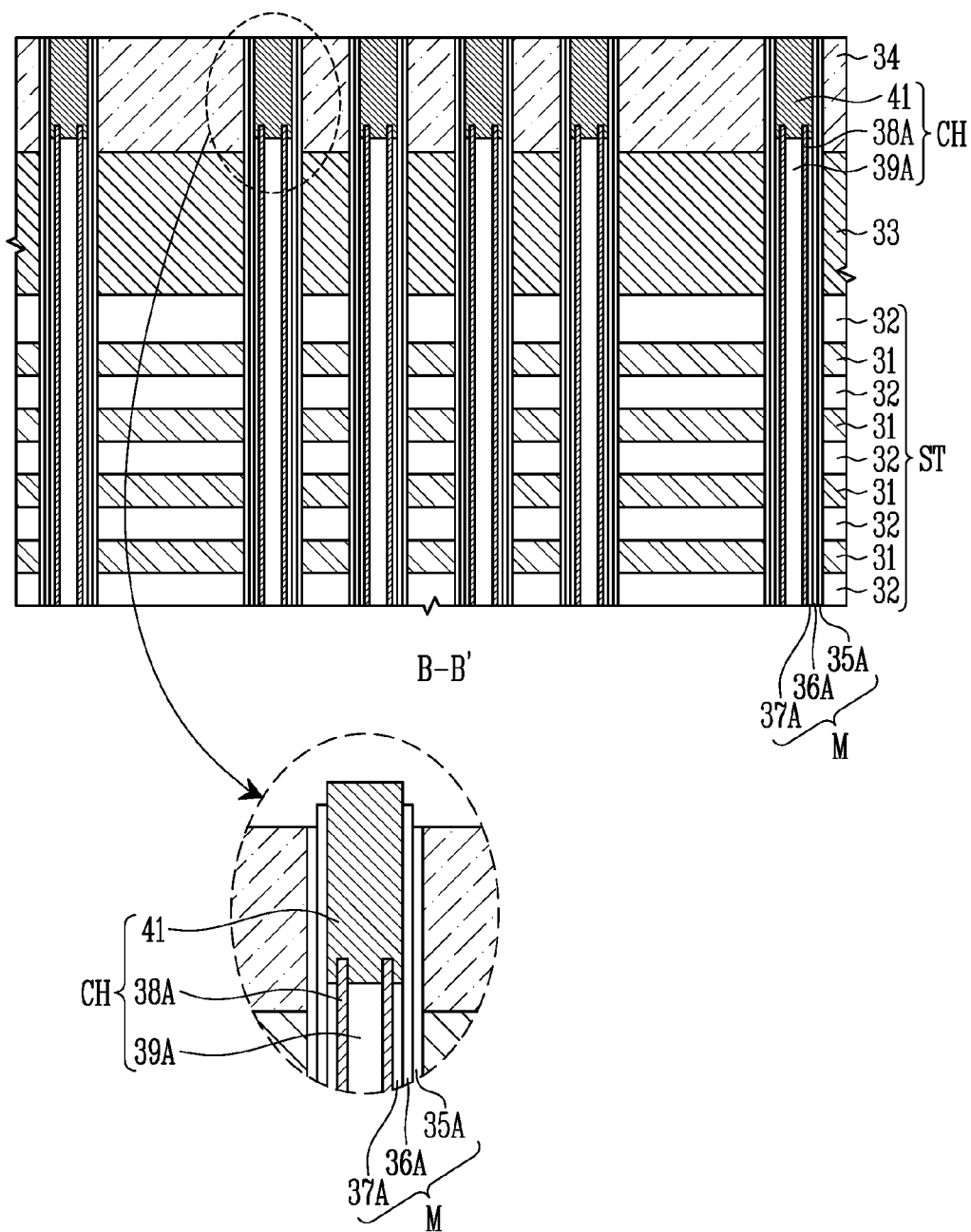

Subsequently, referring to FIGS. 2A, 2B and 2E, a recess region may be formed by etching the insulating core 39. The recessed region may be provided to form a channel pad. An upper surface of an etched insulating core 39A may be located at a higher level than an upper surface of the conductive layer 33. An upper portion of the channel layer 38 may be exposed by the etched insulating core 39A. Subsequently, channel layers 38A may be formed by etching the channel layer 38. Tunnel insulating layers 37A may then be formed by etching the tunnel insulating layer 37. Upper surfaces of the tunnel insulating layers 37A may be located at substantially a same level as that of the insulating core 39. Upper surfaces of the channel layers 38A may protrude above the upper surface of the insulating core 39 or the upper surfaces of the tunnel insulating layers 37A.

Subsequently, channel pads 41 may be coupled to the channel layers 38A, respectively. According to an embodiment, after a conductive layer is formed, the channel pads 41 may be formed by planarizing the conductive layer until the upper surface of the sacrificial layer 34 is exposed. The planarization may be performed using a chemical mechanical polishing (CMP) process. When the conductive layer is planarized, portions of the blocking layer 35 and the data storage layer 36 that are formed on the upper surface of the stacked structure ST may also be planarized. As a result, blocking layers 35A and data storage layers 36A may be formed in the first openings OP1, respectively. The channel structure CH including the channel layer 38A and the channel pad 41 may be formed. The channel structure CH may further include the insulating core 39A. The channel layers 38A may protrude into the channel pads 41. The channel pads 41 may include a conductive material such as polysilicon, tungsten, or molybdenum.

The upper surfaces of the channel pads 41, the data storage layers 36A and the blocking layers 35A may be located at substantially the same or different levels in comparison with each other. Depending on etch rates of the channel pads 41, the data storage layers 36A and the blocking layers 35A, the upper surfaces thereof may be located at different levels in comparison with each other. A layer or a pad having a material with a lower etch rate may be less etched during planarization, such that an upper surface thereof may be located at a higher level. According to an embodiment, the upper surfaces of the channel pads 41 may be located at a higher level than those of the data storage layers 36A. The upper surfaces of the data storage layers 36A may be located at a higher level than those of the blocking layers 35A.

Figure 2F:
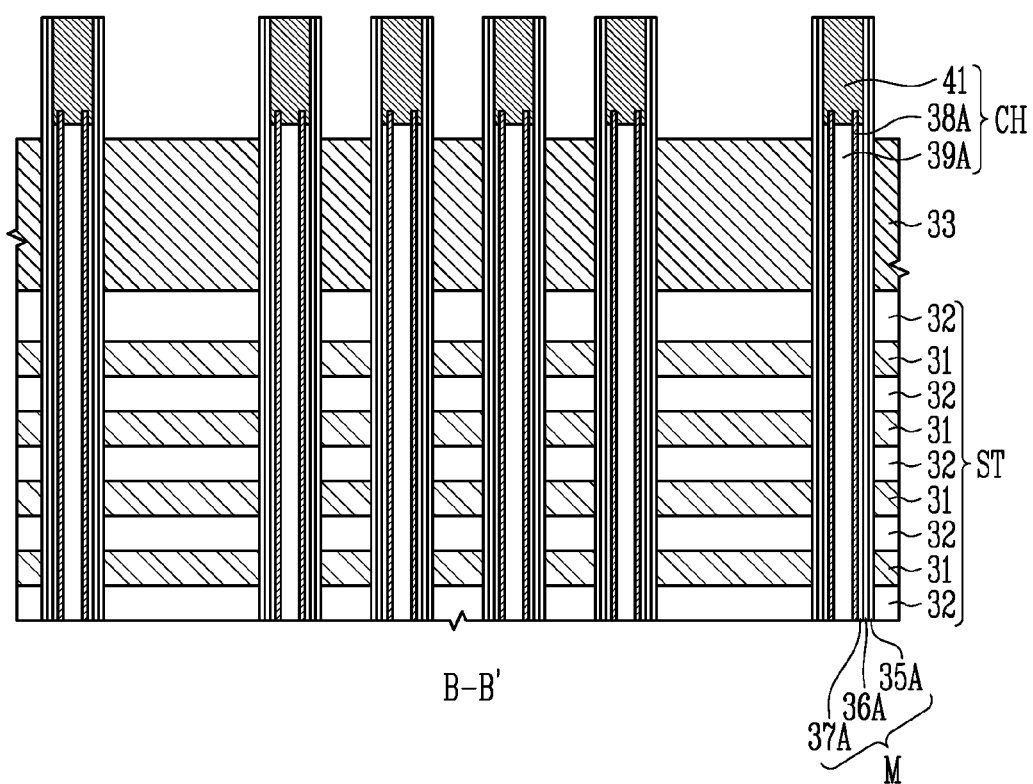

Subsequently, referring to FIGS. 2A, 2B and 2F, the sacrificial layer 34 may be removed. The sacrificial layer 34 may be removed using a dip-out process. As a result, the channel structure CH may protrude above the upper surface of the conductive layer 33, and the channel pads 41 may protrude above the upper surface of the conductive layer 33. In addition, the memory layer M surrounding the channel structure CH may be exposed.

Figure 3A:
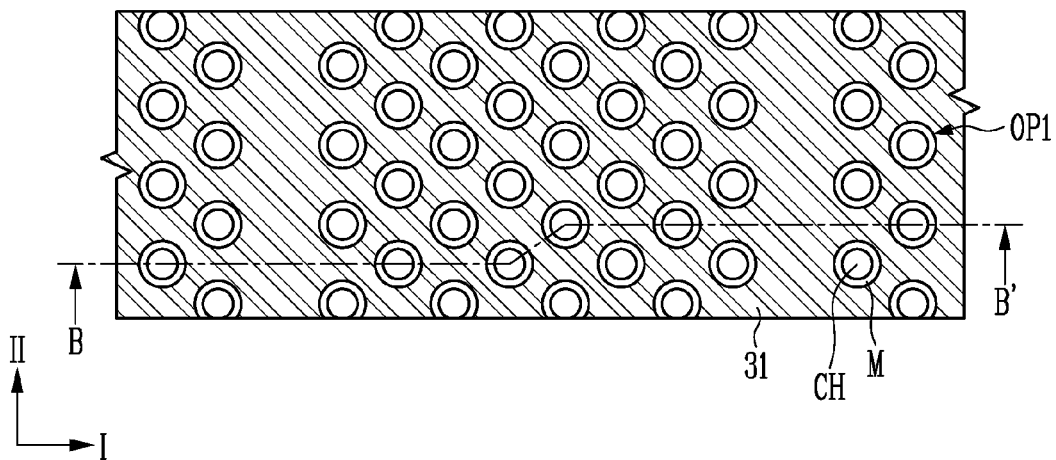
Figure 3B:
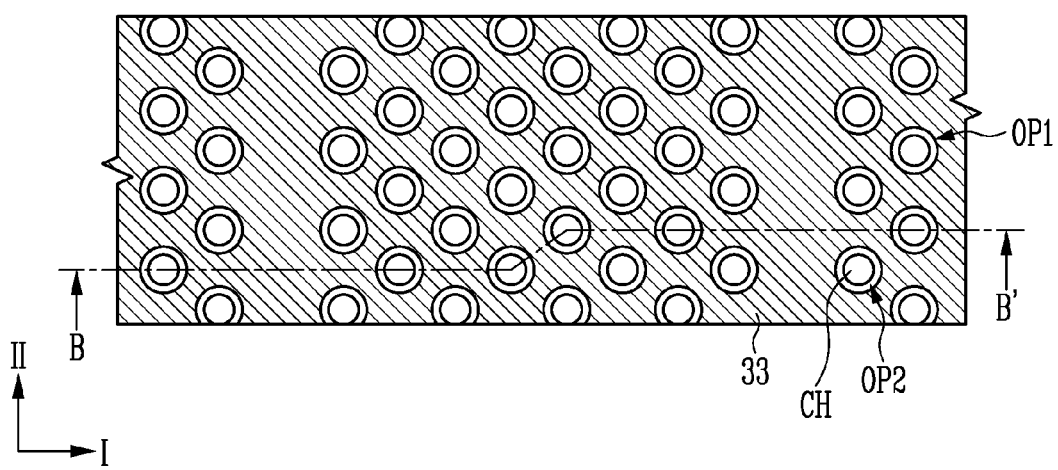
Figure 3C:
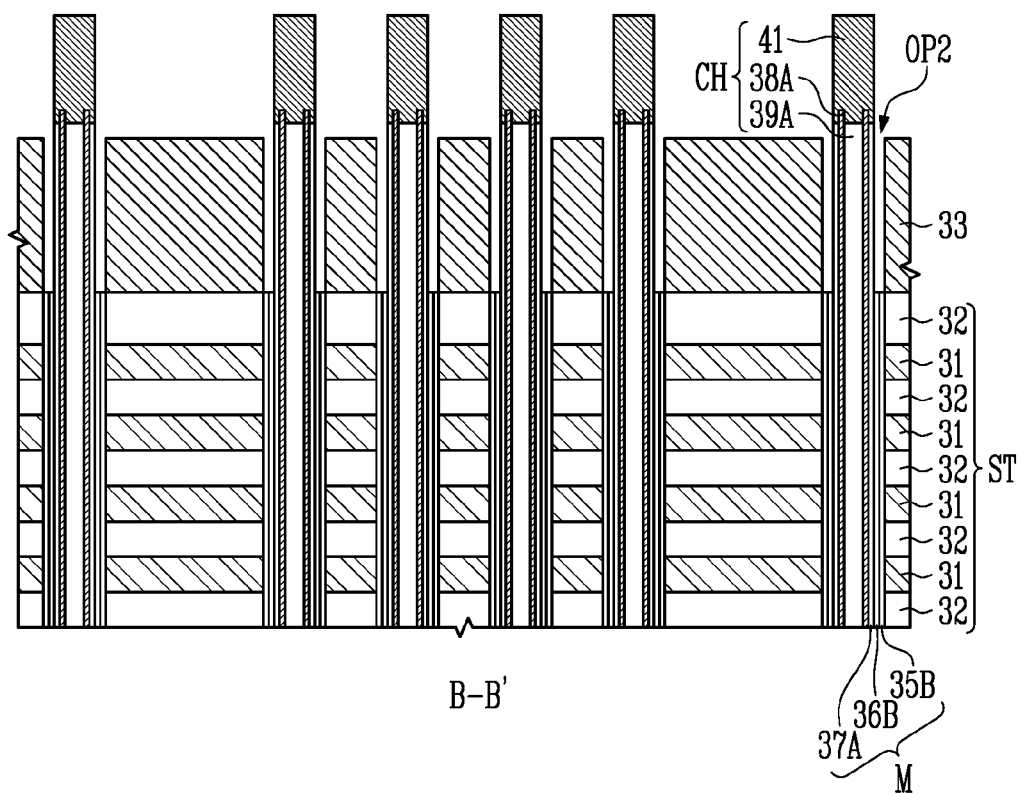

Referring to FIGS. 3A to 3C, the second openings OP2 may be formed between the channel structure CH and the conductive layer 33. The second openings OP2 may be formed by etching the memory layer M. Each of the second openings OP2 may have a ring shape surrounding each of the channel structures CH. According to an embodiment, blocking patterns 35B may be formed by selectively etching the blocking layers 35A. The blocking layers 35A may be etched using a dry cleaning process. Subsequently, data storage patterns 36B may be formed by selectively etching the data storage layers 36A. The data storage layers 36A may be etched using a dry cleaning process. The second openings OP2 may be formed at portions from which the blocking layers 35A and the data storage layers 36A are etched.

The data storage layers 36A and the blocking layers 35A may be etched to a depth to expose the uppermost second material layer 32. The data storage layers 36A and the blocking layers 35A may be etched to a depth wherein the uppermost first material layer 31 is not exposed. When the uppermost second material layer 32 has a greater thickness than the other second material layers 32, the uppermost second material layer 32 may prevent the uppermost first material layer 31 from being exposed when the data storage layers 36A and the blocking layers 35A are etched.

Referring to FIGS. 4A to 4D, conductive patterns 42A may be formed in the second openings OP2. First, referring to FIGS. 4A to 4C, a conductive material layer 42 may be formed on the conductive pads 41 and the upper surface of conductive material layer 33. The conductive material layer 42 may have the same or different materials than the materials of the conductive layer 33. The conductive material layer 42 may include a material having a lower specific resistance than that of the conductive layer 33. The conductive material layer 42 may include a conductive material such as polysilicon, doped polysilicon, a metal, a metal nitride, or a metal silicide. According to an embodiment, the conductive material layer 42 may include tungsten, tungsten nitride, tungsten silicide, titanium, titanium nitride, titanium silicide, tantalum, tantalum nitride, tantalum silicide, molybdenum, molybdenum nitride, molybdenum silicide, or a combination thereof.

The conductive material layer 42 may fill the second openings OP2 and surround the channel pads 41. The conductive material layer 42 may include a first portion P1 and a second portion P2. The first portion P1 may be formed in the second openings OP2. The second portion P2 may surround protruding portions of the channel structures CH. In addition, the conductive material layer 42 may include a third portion P3 that may be formed on the upper surface of the conductive layer 33. The conductive material layer 42 may be formed using a deposition process. During the deposition process, a seam may be formed in the conductive material layer 42. According to an embodiment, the seam may be formed at a position corresponding to the second portion P2, or at a position where the first portion P1 and the second portion P2 are coupled to each other.

Subsequently, an additional process may be performed with respect to materials of the conductive layer 33 and the conductive material layer 42. According to an embodiment, when the conductive layer 33 includes polysilicon and the conductive material layer 42 includes a metal, the conductive layer 33 may be silicided by performing heat treatment thereon.

Figure 4A:
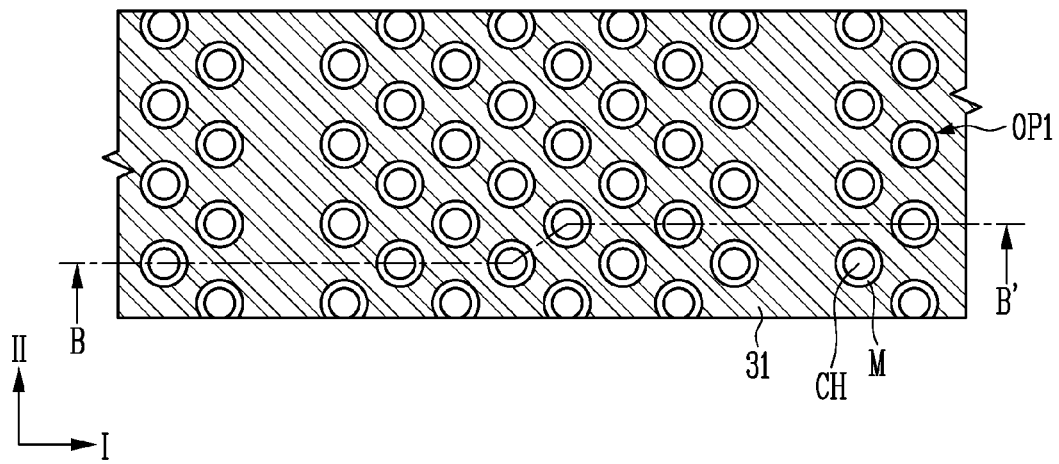
Figure 4B:
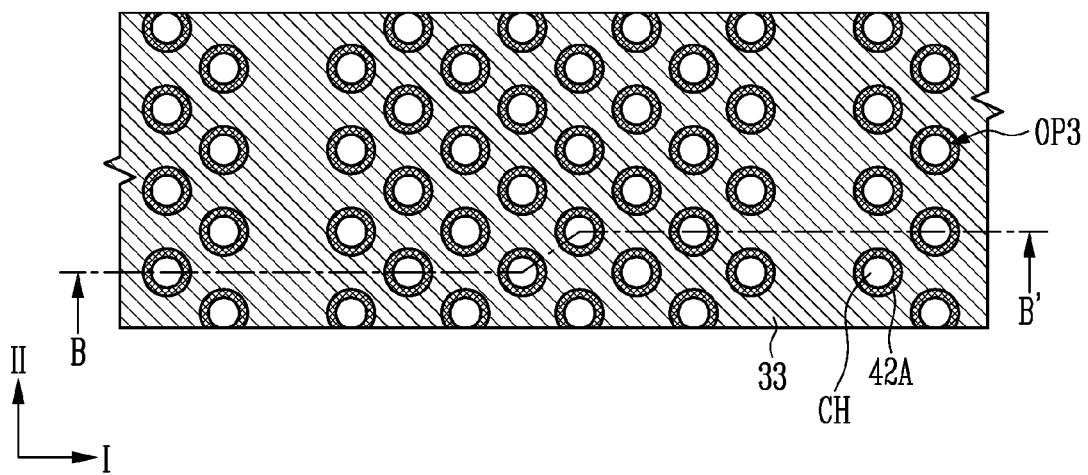
Figure 4C:
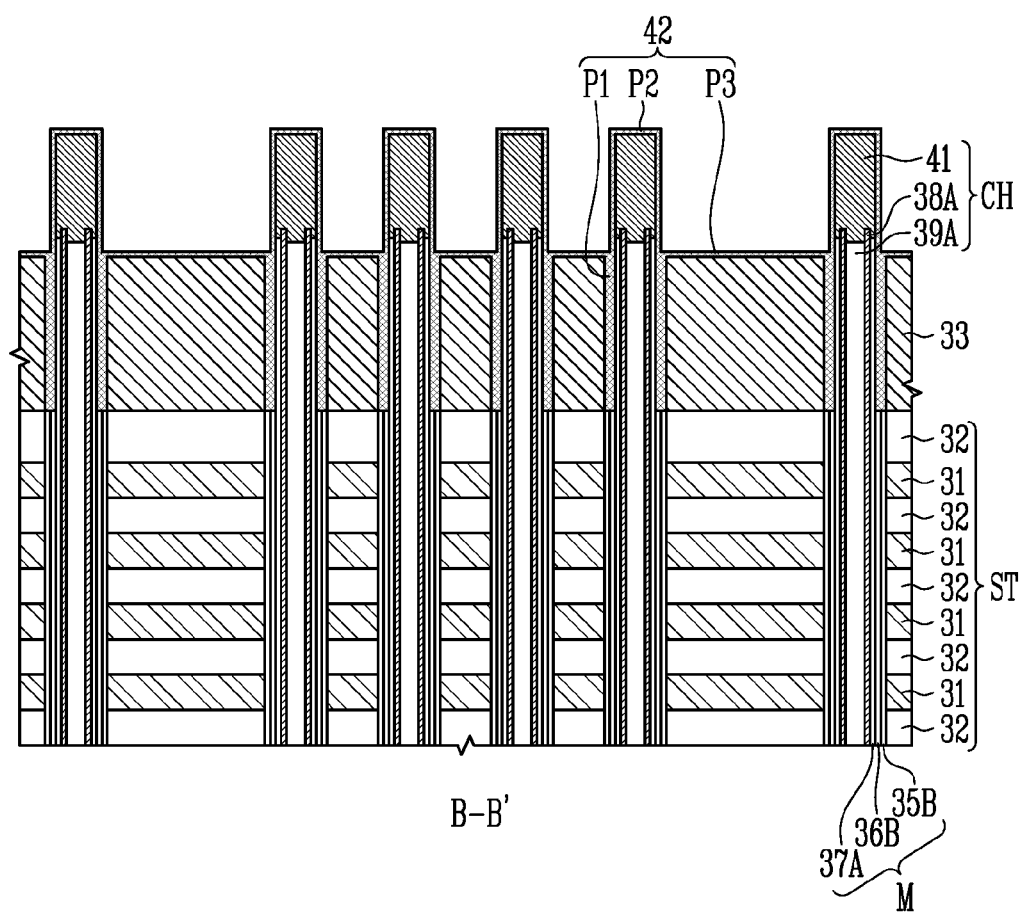
Figure 4D:
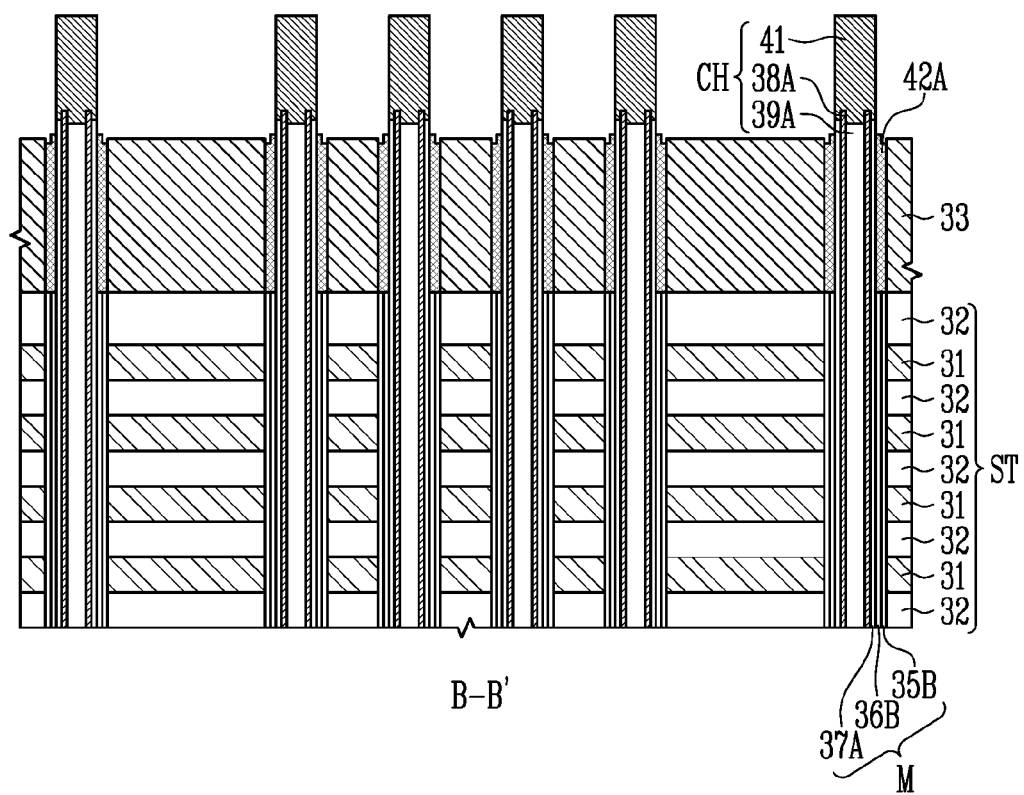

Referring to FIGS. 4A, 4B and 4D, the conductive material layer 42 may be etched to form the conductive patterns 42A. By etching the second portion P2 of the conductive material layer 42, the conductive patterns 42A may be formed. The third portion P3 may also be etched when the second portion P2 is etched. The conductive material layer 42 may be formed using a dry cleaning process. As a result, the channel pads 41 and the conductive patterns 42A may be separated from each other. When a seam is exposed during the etching process of the conductive material layer 42, an etch rate of the corresponding portion may be increased compared to the other portions. As a result, the conductive patterns 42A may have irregular upper surfaces. For example, protrusions or recesses may be formed in the upper surfaces of the conductive patterns 42A.

The conductive patterns 42A may be interposed between the tunnel insulating layers 37A and the conductive layer 33, respectively. Each of the conductive patterns 42A may have a ring shape including a third opening OP3. The conductive patterns 42A may be electrically coupled to the conductive layer 33.

Figure 5A:
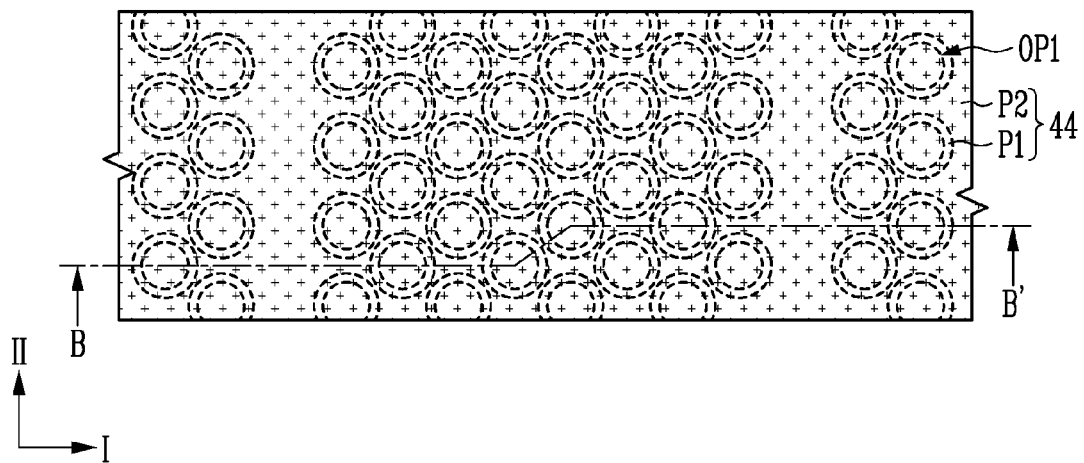
Figure 5B:
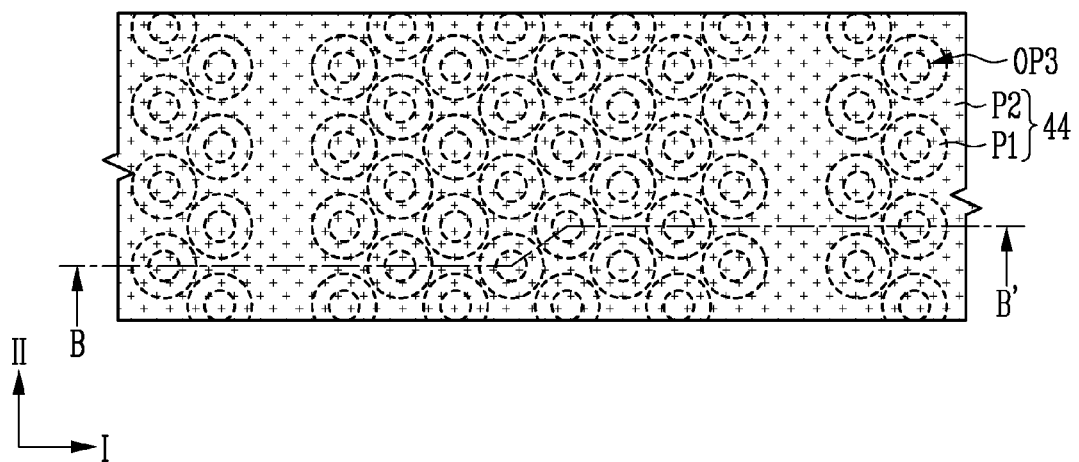

Referring to FIGS. 5A to 5C, an insulating protective layer 43 may be formed. The insulating protective layer 43 may surround the protruding portions of the channel structures CH. The insulating protective layer 43 may surround the exposed channel pads 41 and tunnel insulating layer 37A. The insulating protective layer 43 may surround the upper surface of the conductive layer 33. The insulating protective layer 43 may include an insulating material such as an oxide or a nitride. The insulating protective layer 43 may be formed using a deposition process and may be conformally formed along the profile of the channel pads 41.

Subsequently, a spacer material layer 44 may be formed over the insulating protective layer 43. The spacer material layer 44 may serve as an etch barrier during subsequent processes and include a material having a greater etch selectivity than the conductive layer 33. The spacer material layer 44 may include a carbon layer, an amorphous carbon layer, or the like.

The spacer material layer 44 may include first portions P1 surrounding the channel structures CH and a second portion P2 coupling the first portions P1. A space SP that is deposited with no spacer material may exist between the first portions P1. The first portions P1 may have a greater thickness than the second portion P2. Each of the first portions P1 may have an overhang structure so that an upper part thereof may be thicker than a lower part thereof. The spacer material layer 44 may be formed using a deposition process with poor step coverage. According to an embodiment, the spacer material layer 44 may be formed using Plasma Enhanced Chemical Vapor Deposition (PE-CVD), Physical Vapor Deposition (PVD), or the like.

Figure 6A:
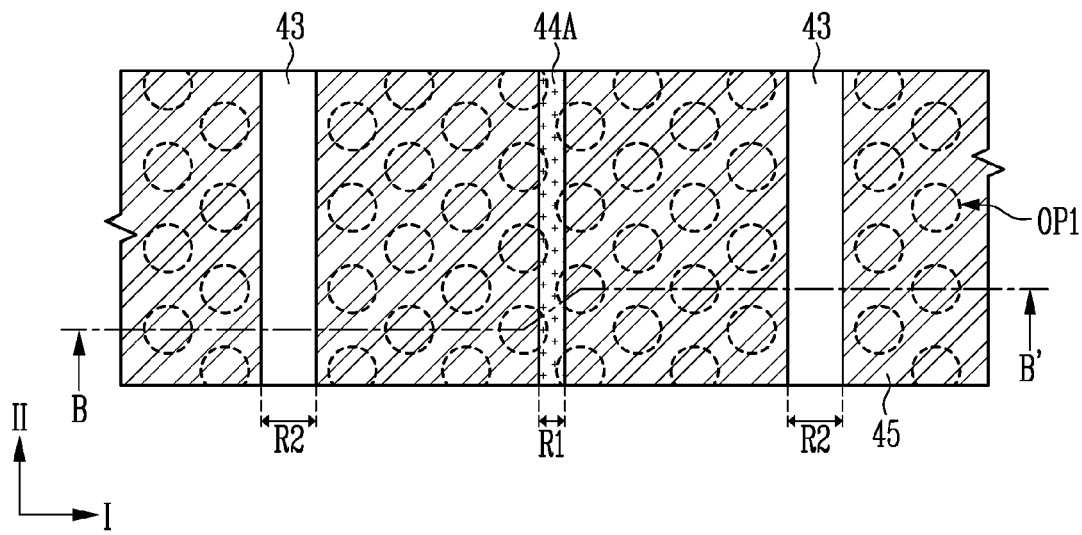
Figure 6B:
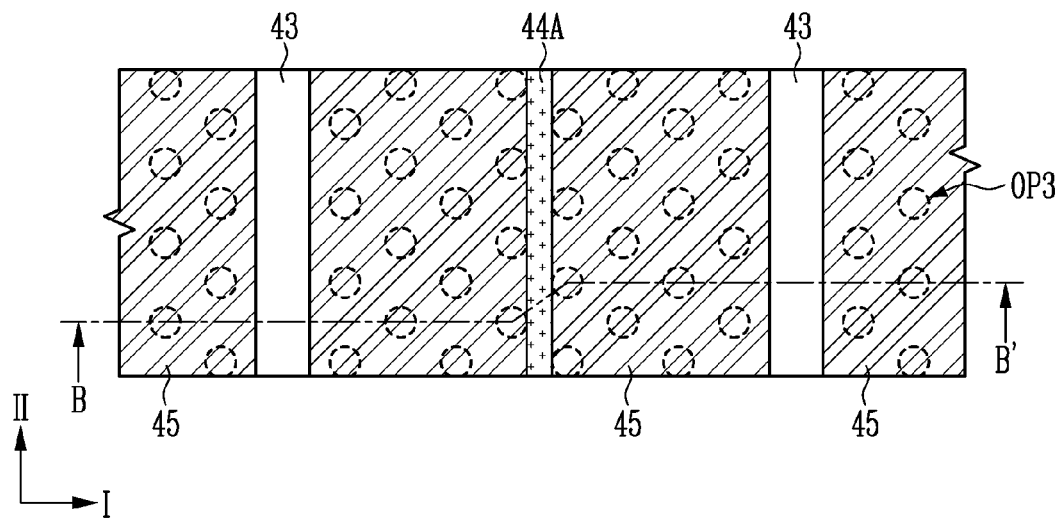
Figure 6C:
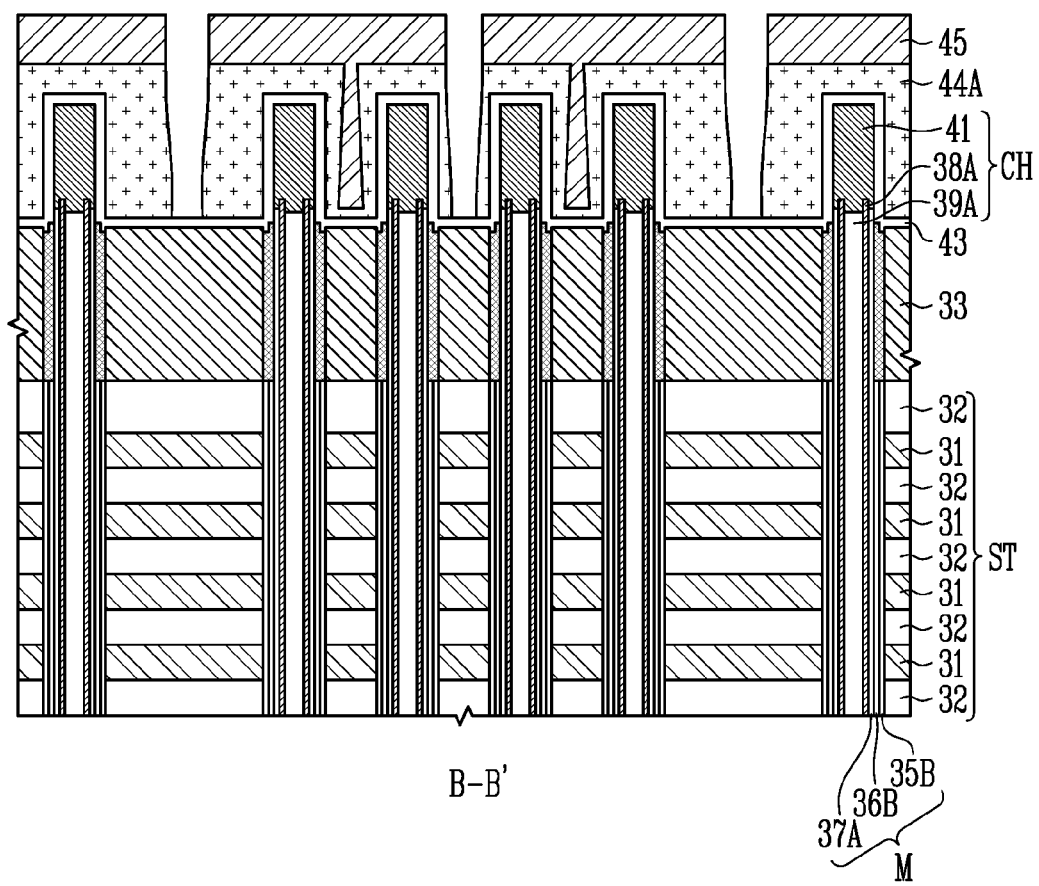

Referring to FIGS. 6A to 6C, a mask pattern 45 may be formed on the spacer material layer 44. The mask pattern 45 may include line patterns extending in the second direction II. The mask pattern 45 may cover the channel structures CH and expose a first region R1 where an isolation insulating pattern is formed and a second region R2 where a slit structure is formed.

By etching the spacer material layer 44 using the mask pattern 45 as an etch barrier, spacers 44A may be formed on the sidewalls of the channel structures CH. The second portion P2 of the spacer material layer 44 may be etched. An area of the first portion P1 that is thicker than the other areas may be etched from the upper part of the channel structure CH. As a result, the insulating protective layer 43 may be exposed.

Referring to FIGS. 7A to 7D, fourth openings OP4 may be formed through the conductive layer 33 and isolation insulating patterns 46A may be formed in the fourth openings OP4. First, referring to FIGS. 7A to 7C, the insulating protective layer 43 and the conductive layer 33 may be etched using the mask pattern 45 and the spacers 44A as an etch barrier. According to an embodiment, under the condition that the conductive layer 33 has a high etch selectivity with respect to the spacers 44A, the conductive layer 33 may be selectively etched. As a result, the fourth opening OP4 and a fifth opening OP5 may be formed. The fourth opening OP4 and the fifth opening OP5 may pass through the conductive layer 33 and extend between the spacers 44A.

The fourth opening OP4 and the fifth opening OP5 may pass through the conductive layer 33 and have a depth which does not expose the uppermost first material layer 31. The fourth opening OP4 may be located at a portion corresponding to the first region R1. The fifth opening OP5 may be located at a portion corresponding to the second region R2. The fourth opening OP4 may have a smaller width than the fifth opening OP5.

The conductive patterns 42A may be exposed when the conductive layer 33 is etched. However, the conductive patterns 42A may be etched when the conductive layer 33 is etched. At least one of the conductive patterns 42A located adjacent to the first region R1 may be etched or exposed. As a result, conductive structures CS extending in the second direction II may be formed. Each of the conductive structures CS may include a conductive layer 33A and the conductive patterns 42A. Subsequently, the mask pattern 45 and the spacers 44A may be removed and a cleaning process may be performed.

Figure 7A:
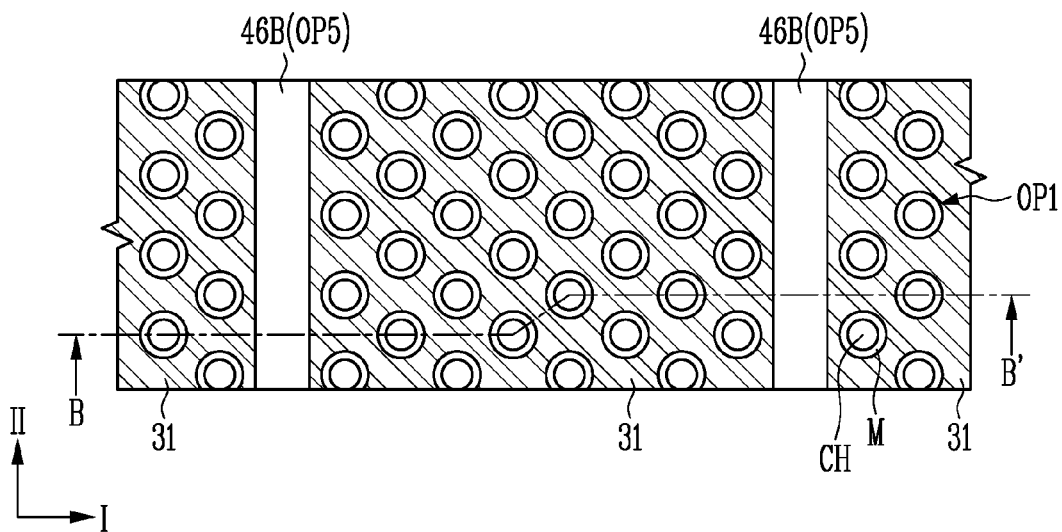
Figure 7B:
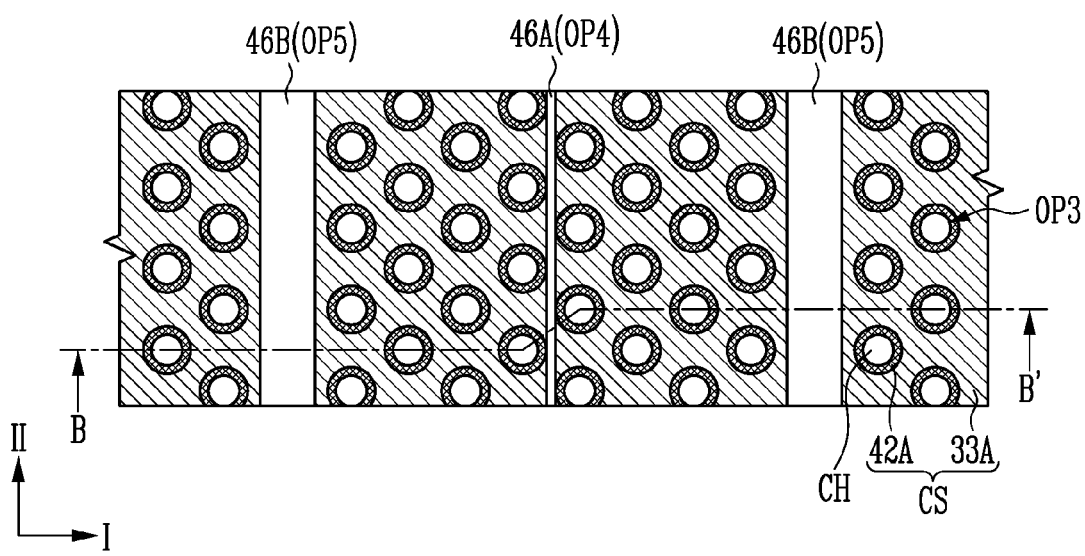
Figure 7C:
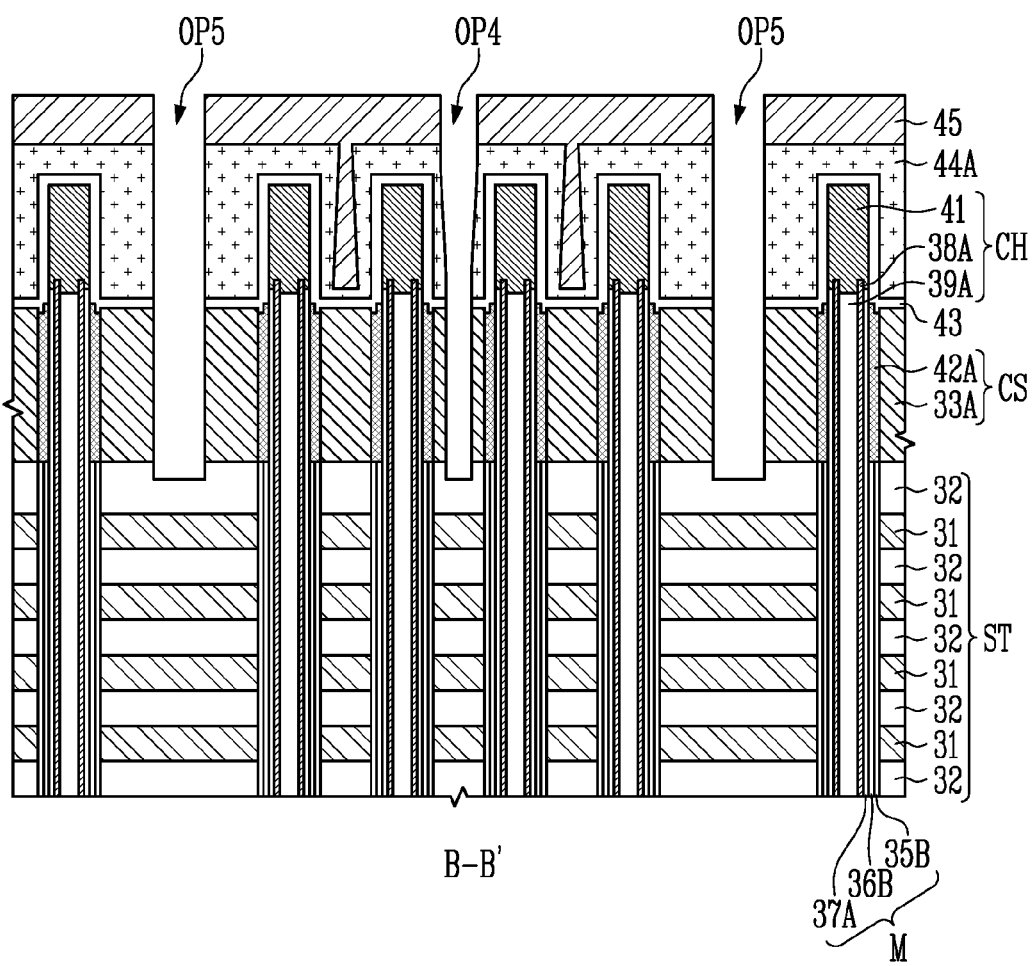
Figure 7D:
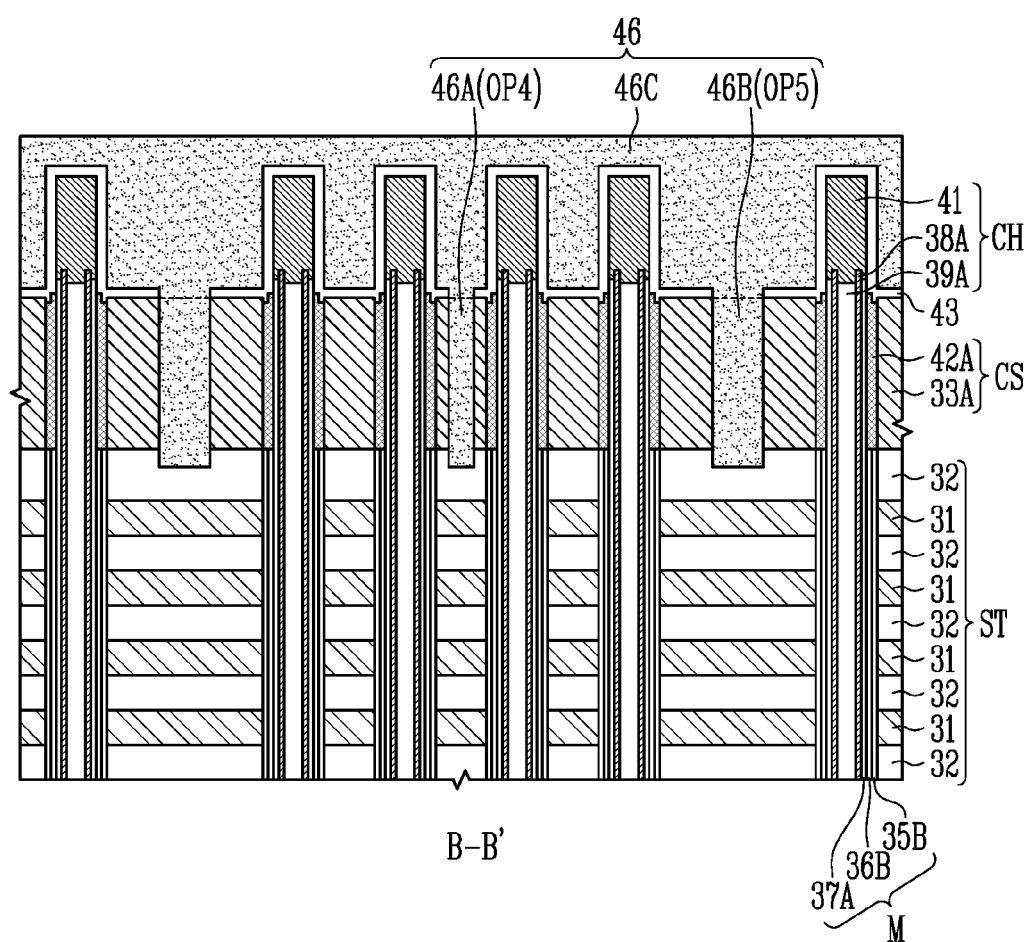

Subsequently, referring to FIGS. 7A, 7B and 7D, an isolation insulating pattern 46A may be formed in the fourth opening OP4. When the isolation insulating pattern 46A is formed, a sacrificial pattern 46B may also be formed in the fifth opening OP5. When the isolation insulating pattern 46A is formed, an interlayer insulating layer 46C may also be formed. The isolation insulating pattern 46A, the sacrificial pattern 46B and the interlayer insulating layer 46C may be coupled into a single layer.

According to an embodiment, an insulating material layer may be formed on the conductive structure CS. The insulating material layer may be formed in the fourth opening OP4 and the fifth opening OP5 and may be formed on the insulating protective layer 43. After the insulating material layer is formed, a planarizing process may be performed thereon to thereby form an insulating layer 46. The insulating layer 46 may include the isolation insulating pattern 46A, the sacrificial pattern 46B and the interlayer insulating layer 46C.

However, the insulating layer 46 may be formed without removing the spacers 44A. The remaining spacers 44A may serve, together with the insulating layer 46, as an interlayer insulating layer.

Referring to FIGS. 8A to 8D, the slit structure SLS may pass through the conductive structure CS and the stacked structure ST.

Figure 8A:
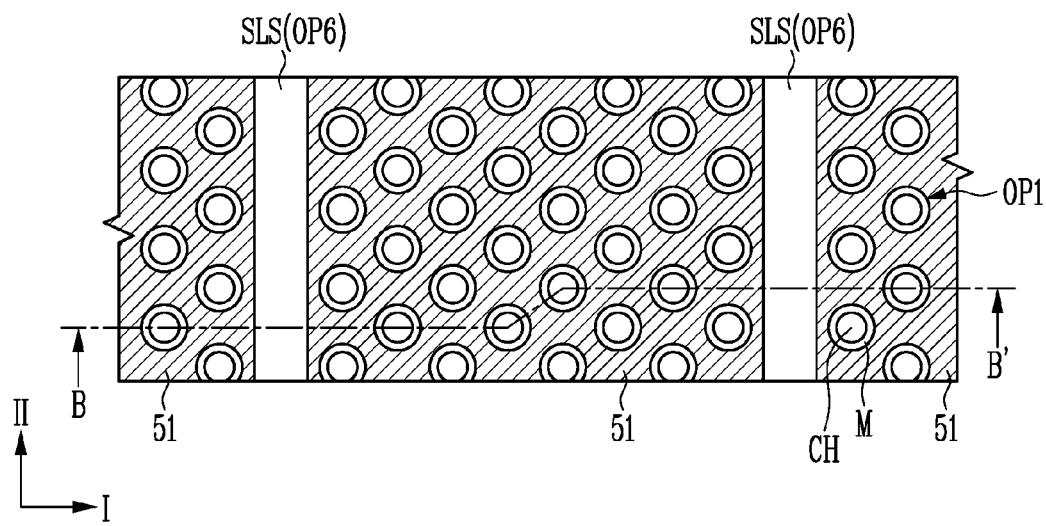
Figure 8B:
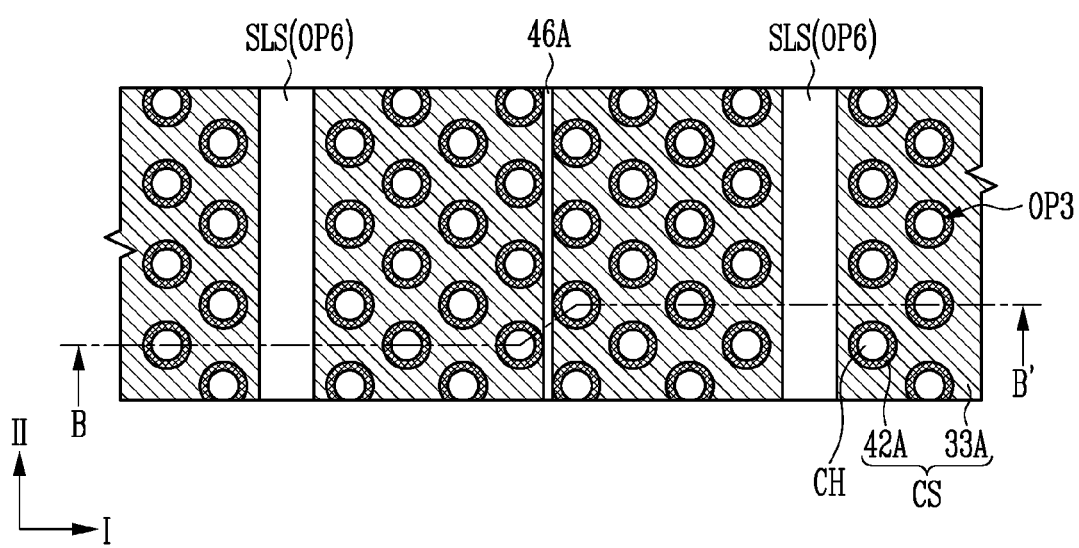
Figure 8C:
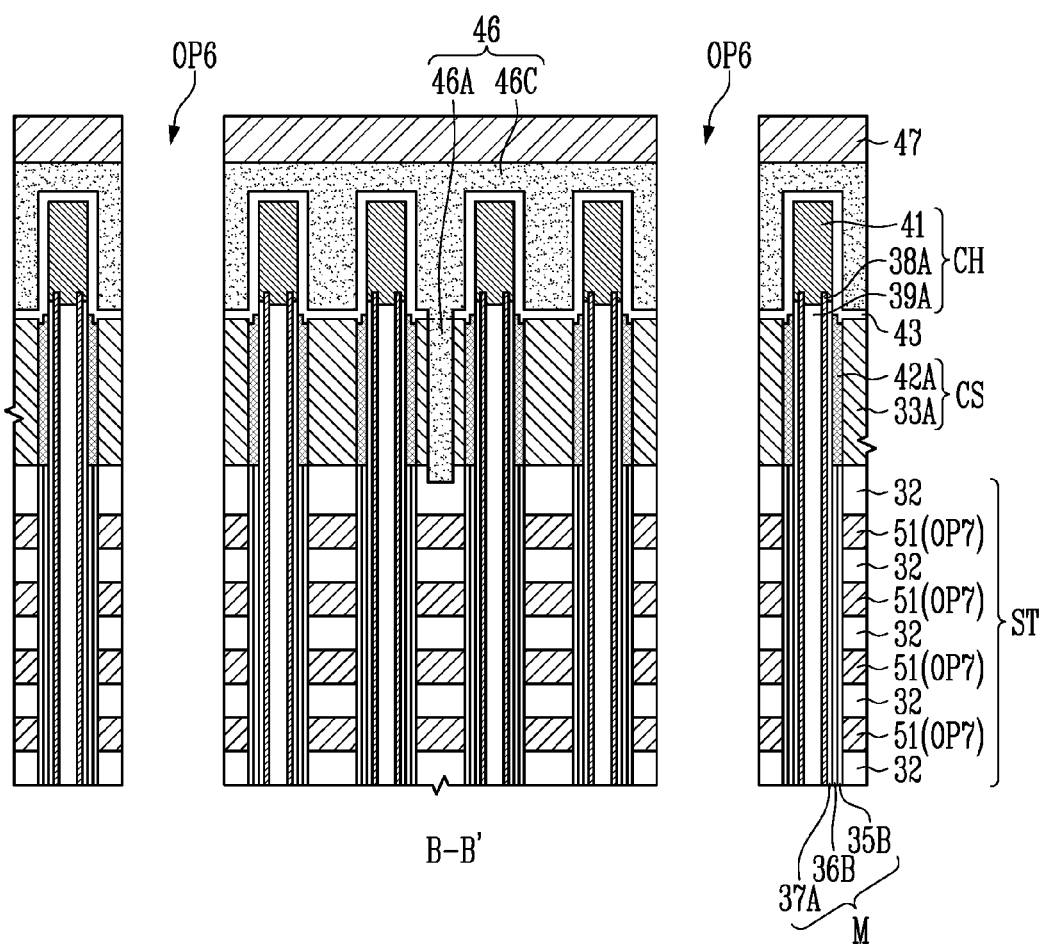

First, referring to FIGS. 8A to 8C, a mask pattern 47 may be formed on the insulating layer 46. The mask pattern 47 may be formed to expose the second region R2. Subsequently, the insulating layer 46 and the stacked structure ST may be etched using the mask pattern 47 as an etch barrier. As a result, a sixth opening OP6 may pass through the insulating layer 46, the conductive structure CS and the stacked structure ST. According to an embodiment, the sixth opening OP6 may have a depth such that the source structure located under the stacked structure ST is exposed.

Subsequently, seventh openings OP7 may be formed by removing the first material layers 31 through the sixth opening OP6. Third material layers 51 may be formed in the seventh openings OP7. According to an embodiment, the third material layers 51 may include a conductive material such as polysilicon, tungsten, molybdenum, or a metal. At least one lowermost third material layer 51, among the third material layers 51, may be a source select line, and the other third material layers 51 may be word lines.

Figure 8D:
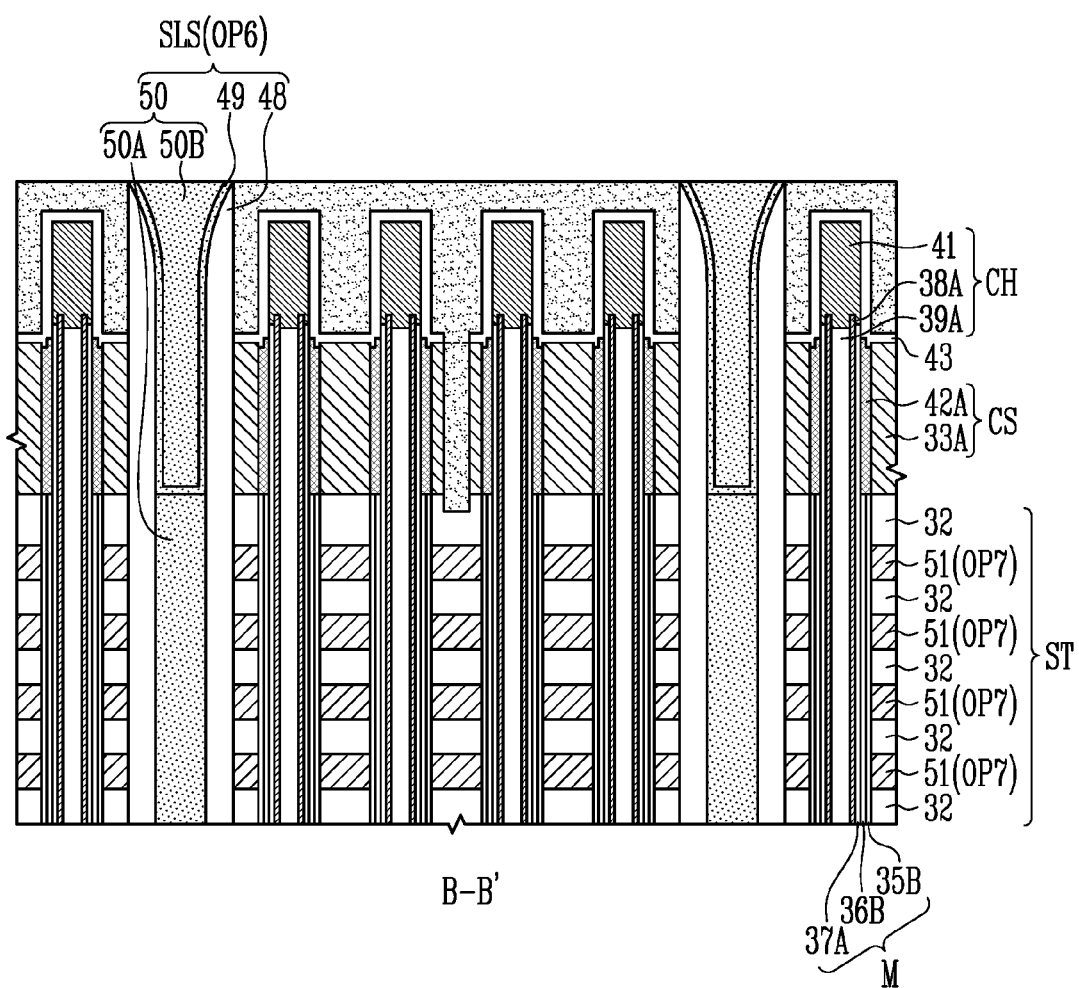

Referring to FIGS. 8A, 8B and 8D, the slit structure SLS may be formed in the sixth opening OP6. After an insulating spacer 48 is formed in the sixth opening OP6, a source contact structure 50 may be formed in the insulating spacer 48. According to an embodiment, the source contact structure 50 may be formed in a single layer by filling the insulating spacer 48 with a conductive material layer. The single layer may include polysilicon. According to an embodiment, a first contact structure 50A, a barrier layer 49, and a second contact structure 50B may be formed in a sequential manner in the sixth opening OP6. The second contact structure 50B may include a material having a lower specific resistance than the first contact structure 50A.

According to the above-described manufacturing method, the spacers 44A be formed using the step difference between the upper surface of the conductive layer 33 and the upper surface of the channel structure CH. In addition, the conductive layer 33 may be etched using the spacers 44A and the mask pattern 45 as an etch barrier. Accordingly, by etching the conductive layer 33 by self-alignment, a region where the isolation insulating pattern 46A is formed may be defined. In addition, by replacing the data storage layer and the blocking layer with the conductive pattern 42A in a level corresponding to the conductive structure CS, a region where the isolation insulating pattern 46A is formed may be ensured, and a select transistor having a GAA structure may be formed.

Figure 9:
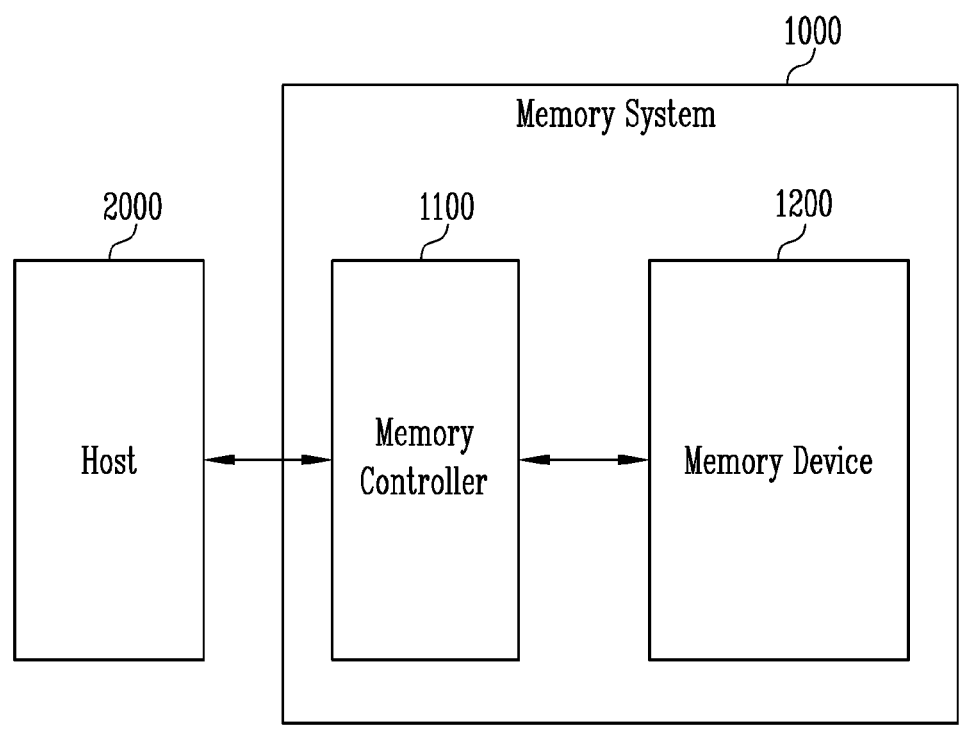
FIG. 9 is a block diagram illustrating a memory system according to an embodiment of the present disclosure.

FIG. 9 is a block diagram illustrating a memory system 1000 according to an embodiment of the present disclosure.

Referring to FIG. 9, the memory system 1000 may include a memory device 1200 configured to store data and a controller 1100 configured to perform communications between the memory device 1200 and a host 2000.

The host 2000 may be a device or system configured to store data in the memory system 1000 or retrieve data from the memory system 1000. The host 2000 may generate requests for various operations and output the generated requests to the memory system 1000. The requests may include a program request for a program operation, a read request for a read operation, and an erase request for an erase operation. The host 2000 may communicate with the memory system 1000 by using at least one interface protocol among, for example, Peripheral Component Interconnect Express (PCIe), Advanced Technology Attachment (ATA), Serial ATA (SATA), Parallel ATA (PATA), Serial Attached SCSI (SAS), Non-Volatile Memory express (NVMe), Universal Serial Bus (USB), Multi-Media Card (MMC), Enhanced Small Disk Interface (ESDI), and Integrated Drive Electronics (IDE).

The host 2000 may include at least one of a computer, a portable digital device, a tablet, a digital camera, a digital audio player, a television, a wireless communication device, or a cellular phone. However, embodiments of the disclosed technology are not limited thereto.

The controller 1100 may control overall operations of the memory system 1000. The controller 1100 may control the memory device 1200 in response to the requests of the host 2000. The controller 1100 may control the memory device 1200 to perform a program operation, a read operation and an erase operation at the request of the host 2000. Alternatively, the controller 1100 may perform a background operation for performance improvement of the memory system 1000 in the absence of the request from the host 2000.

To control the operations of the memory device 1200, the controller 1100 may transfer a control signal and a data signal to the memory device 1200. The control signal and the data signal may be transferred to the memory device 1200 through different input/output lines. The data signal may include a command, an address, or data. The control signal may be used to differentiate periods wherein the data signal is input.

The memory device 1200 may perform a program operation, a read operation and an erase operation in response to control of the controller 1100. The memory device 1200 may be a volatile memory that loses data when a power supply is blocked, or a non-volatile memory that retains data in the absence of power supply. The memory device 1200 may have the structure as described above with reference to FIGS. 1A to 1E. In addition, the memory device 1200 may be the semiconductor device manufactured by the method as described above with reference to FIGS. 2A to 8D. According to an embodiment, the semiconductor memory device may include a stacked structure that includes first conductive layers and insulating layers stacked alternately with each other; second conductive layers located on the stacked structure, first openings passing through the second conductive layers and the stacked structure and having a first width; second conductive patterns formed in the first openings and located on the stacked structure to be electrically coupled to the second conductive layers; data storage patterns formed in the first openings and located under the second conductive patterns; and channel layers formed in the data storage patterns and the second conductive patterns.

Figure 10:
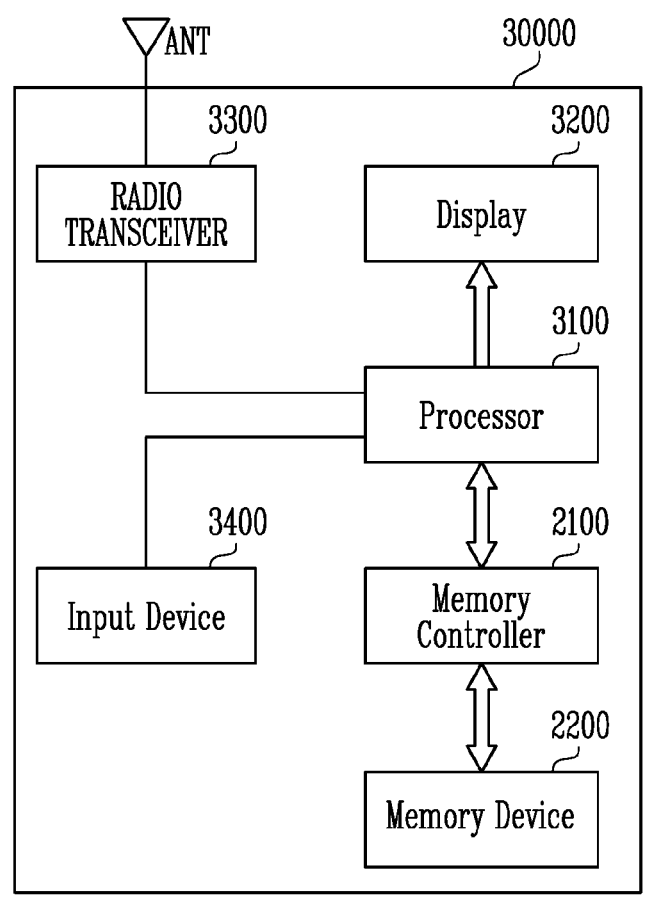
FIG. 10 is a block diagram illustrating a memory system according to an embodiment of the present disclosure.

FIG. 10 is a block diagram illustrating a memory system 30000 according to an embodiment of the present disclosure.

Referring to FIG. 10, the memory system 30000 may be incorporated into a cellular phone, a smart phone, a tablet, a personal computer (PC), a personal digital assistant (PDA), or a wireless communication device. The memory system 30000 may include a memory device 2200 and a memory controller 2100 controlling the operations of the memory device 2200.

The memory controller 2100 may control a data access operation of the memory device 2200, for example, a program operation, an erase operation or a read operation of the memory device 2200 in response to control of a processor 3100.

The data programmed into the memory device 2200 may be output through a display 3200 in response to control of the memory controller 2100.

A radio transceiver 3300 may exchange a radio signal through an antenna ANT. For example, the radio transceiver 3300 may change the radio signal received through the antenna ANT into a signal which may be processed by the processor 3100. Therefore, the processor 3100 may process the signal output from the radio transceiver 3300 and transfer the processed signal to the memory controller 2100 or the display 3200. The memory controller 2100 may transfer the signal processed by the processor 3100 into the memory device 2200. In addition, the radio transceiver 3300 may change a signal output from the processor 3100 into a radio signal and output the radio signal to an external device through the antenna ANT. A control signal for controlling the operations of the host or data to be processed by the processor 3100 may be input by an input device 3400, and the input device 3400 may include a pointing device, such as a touch pad and a computer mouse, a keypad, or a keyboard. The processor 3100 may control the operations of the display 3200 so that data output from the memory controller 2100, data output from the radio transceiver 3300, or data output from an input device 3400 may be output through the display 3200.

According to an embodiment, the memory controller 2100 capable of controlling the operations of the memory device 2200 may be realized as a portion of the processor 3100, or as a separate chip from the processor 3100.

Figure 11:
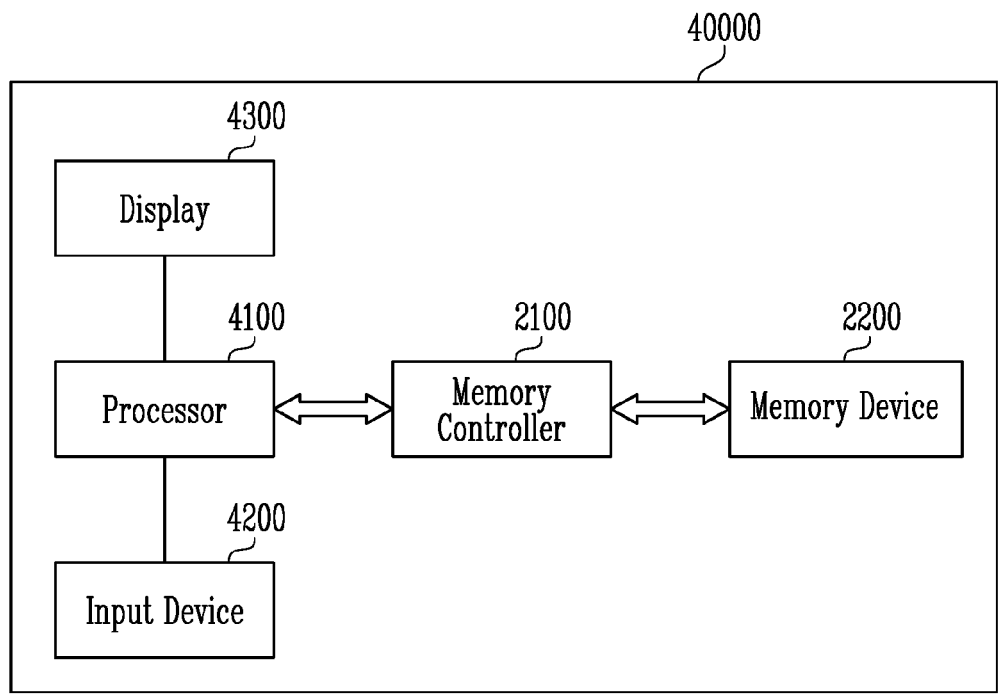
FIG. 11 is a block diagram illustrating a memory system according to an embodiment of the present disclosure.

FIG. 11 is a block diagram illustrating a memory system 40000 according to an embodiment of the present disclosure.

Referring to FIG. 11, the memory system 40000 may be incorporated into a personal computer (PC), a tablet PC, a net-book, an e-reader, a personal digital assistant (PDA), a portable multimedia player (PMP), an MP3 player, or an MP4 player.

The memory system 40000 may include the memory device 2200 and the memory controller 2100 that controls a data processing operation of the memory device 2200.

A processor 4100 may output data stored in the memory device 2200 through a display 4300 according to data input through an input device 4200. Examples of the input device 4200 may include a pointing device such as a touch pad or a computer mouse, a keypad, or a keyboard.

The processor 4100 may control overall operations of the memory system 40000 and control operations of the memory controller 2100. According to an embodiment, the memory controller 2100 capable of controlling the operations of the memory device 2200 may be realized as a portion of the processor 4100, or as a separate chip from the processor 4100.

Figure 12:
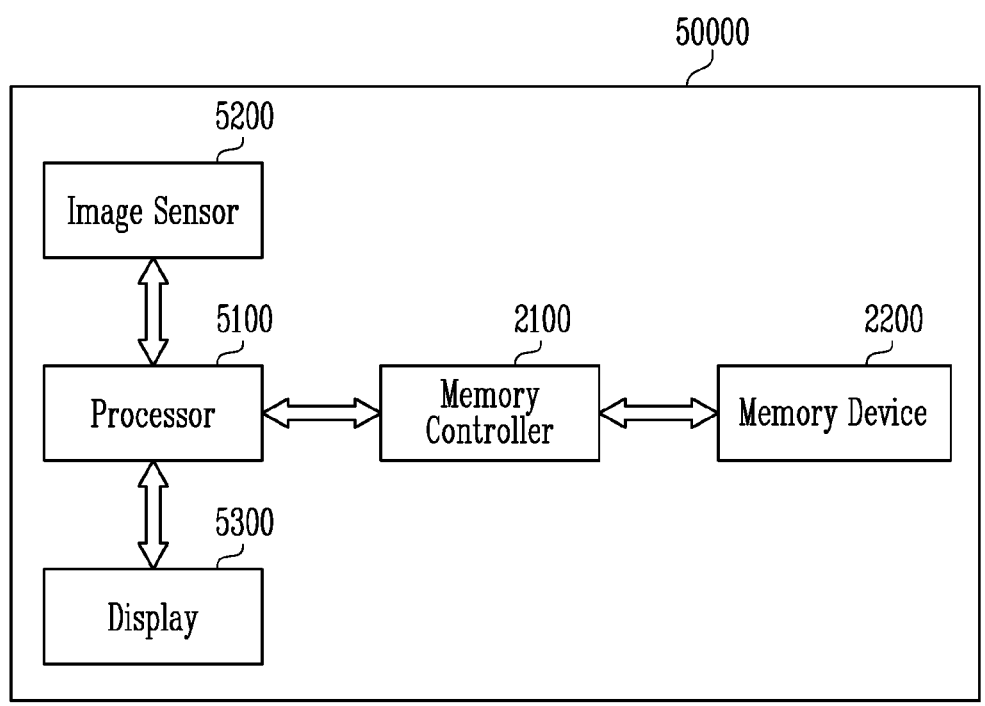
FIG. 12 is a block diagram illustrating a memory system according to an embodiment of the present disclosure.

FIG. 12 is a block diagram illustrating a memory system 50000 according to an embodiment of the present disclosure.

Referring to FIG. 12, the memory system 50000 may be incorporated into an image processor, for example, a digital camera, a cellular phone with a digital camera attached thereto, a smart phone with a digital camera attached thereto, or a table PC with a digital camera attached thereto.

The memory system 50000 may include the memory device 2200 and the memory controller 2100 that controls a data processing operation of the memory device 2200, for example, a program operation, an erase operation, or a read operation.

An image sensor 5200 of the memory system 50000 may convert an optical image into digital signals. The converted digital signals may be transferred to a processor 5100 or the memory controller 2100. In response to control of the processor 5100, the converted digital signals may be output through a display 5300 or stored in the memory device 2200 through the memory controller 2100. In addition, the data stored in the memory device 2200 may be output through the display 5300 in response to control of the processor 5100 or the memory controller 2100.

According to an embodiment, the memory controller 2100 capable of controlling the operations of the memory device 2200 may be formed as a part of the processor 5100, or a separate chip from the processor 5100.

Figure 13:
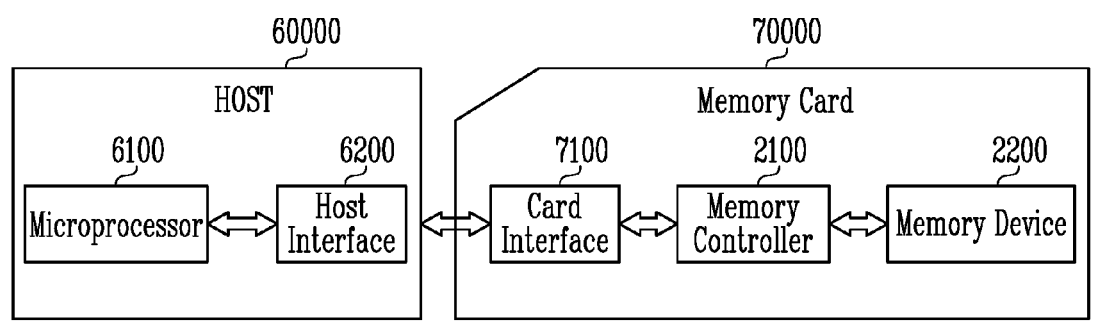
FIG. 13 is a block diagram illustrating a memory system according to an embodiment of the present disclosure.

FIG. 13 is a block diagram illustrating a memory system 70000 according to an embodiment of the present disclosure.

Referring to FIG. 13, the memory system 70000 may include a memory card or a smart card. The memory system 70000 may include the memory device 2200, the memory controller 2100, and a card interface 7100.

The memory controller 2100 may control data exchange between the memory device 2200 and the card interface 7100. According to an embodiment, the card interface 7100 may be, but is not limited thereto, a secure digital (SD) card interface or a multi-media card (MMC) interface.

The card interface 7100 may interface data exchange between a host 60000 and the memory controller 2100 according to a protocol of the host 60000. According to an embodiment, the card interface 7100 may support a Universal Serial Bus (USB) protocol and an InterChip (IC)-USB protocol. The card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, a console video game hardware, or a digital set-top box, the host interface 6200 may perform data communication with the memory device 2200 through the card interface 7100 and the memory controller 2100 in response to control of a microprocessor 6100.

A semiconductor device with a stabilized structure and improved reliability may be provided. In addition, a method of manufacturing a semiconductor device may be simplified at low cost.

What is claimed is:

1. A semiconductor device, comprising:
   a stacked structure with first conductive layers and insulating layers that are stacked alternately with each other;
   a second conductive layer;
   a channel layer extending through the second conductive layer and the stacked structure;
   a second conductive pattern surrounding a sidewall of the channel layer and electrically coupled to the second conductive layer; and
   a data storage pattern surrounding the sidewall of the channel layer and located under the second conductive pattern.

2. The semiconductor device of claim 1, further comprising a tunnel insulating layer located between the channel layer and the data storage pattern and between the channel layer and the second conductive pattern.

3. The semiconductor device of claim 1, further comprising an isolation insulating pattern located between a pair of second conductive layers.

4. The semiconductor device of claim 3, wherein the isolation pattern extends into the stacked structure.

5. The semiconductor device of claim 1, further comprising an insulating protective layer formed on the second conductive layer and the second conductive pattern.

6. The semiconductor device of claim 5, wherein the insulating protective layer has a protrusion part protruded into the second conductive pattern.

7. The semiconductor device of claim 5, wherein the channel layer is protruded from an upper surface of the second conductive layer and the insulating protective layer surrounds a protruded portion of the channel layer.

8. The semiconductor device of claim 1, wherein each of the first conductive layer includes a first sidewall surrounding the channel layer, the second conductive pattern includes a second sidewall surrounding the channel layer, and the second sidewall is located nearer to the channel layer than the first sidewall.

9. The semiconductor device of claim 1, wherein each of the first conductive layers has a first height and the second conductive layer has a second height at least more than twice of the first height.

10. A semiconductor device, comprising:
    a stacked structure including word lines;
    a first select line located over the stacked structure;
    a second select line located over the stacked structure;
    an isolation insulating pattern located between the first select line and the second select line, wherein the isolation insulating pattern is located over the stacked structure;
    a first channel layer extending through the stacked structure and the first select line;
    a second channel layer extending through the stacked structure and the second select line; and
    a first data storage pattern surrounding the first channel layer and located under the first select line.

11. The semiconductor device of claim 10, further comprising:
    a first tunnel insulating layer located between the first channel layer and the first data storage pattern and between the first channel layer and the first select line.

12. The semiconductor device of claim 10, wherein the isolation pattern extends into the stacked structure.

13. The semiconductor device of claim 10, further comprising an insulating protective layer formed on the first conductive layer.

14. The semiconductor device of claim 13, wherein the insulating protective layer has a protrusion part protruded into the first select line.

15. The semiconductor device of claim 13, wherein the first channel layer is protruded from an upper surface of the first select line and the insulating protective layer surrounds a protruded portion of the first channel layer.

16. The semiconductor device of claim 10, wherein each of the word lines includes a first sidewall surrounding the first channel layer, the first select line includes a second sidewall surrounding the first channel layer, and the second sidewall is located nearer to the first channel layer than the first sidewall.

17. The semiconductor device of claim 10, wherein each of the word lines has a first height and the first select line has a second height at least more than twice of the first height.

18. The semiconductor device of claim 10, wherein a top of the first data storage pattern contacts a bottom of the first select line.

* * * * *